United States Patent
Wolterink et al.

(10) Patent No.: US 11,333,980 B2
(45) Date of Patent: *May 17, 2022

(54) METHOD AND APPARATUS FOR EXPOSURE OF FLEXOGRAPHIC PRINTING PLATES USING LIGHT EMITTING DIODE (LED) RADIATION SOURCES

(71) Applicant: Esko-Graphics Imaging GmbH, Itzehoe (DE)

(72) Inventors: Jörg Wolterink, Oelixdorf (DE); Thomas Hänsel, Elmshorn (DE); Wolfgang Sievers, Kremperheide (DE)

(73) Assignee: Esko-Graphics Imaging GmbH, Itzehoe (DE)

(*) Notice: Subject to any disclaimer, the term of this patent is extended or adjusted under 35 U.S.C. 154(b) by 0 days.

This patent is subject to a terminal disclaimer.

(21) Appl. No.: 16/926,076

(22) Filed: Jul. 10, 2020

(65) Prior Publication Data

US 2020/0341378 A1 Oct. 29, 2020

Related U.S. Application Data

(63) Continuation of application No. 15/926,616, filed on Mar. 20, 2018, now Pat. No. 10,732,507, which is a (Continued)

(51) Int. Cl.
*G03F 7/20* (2006.01)
*H05K 3/00* (2006.01)
*G03F 7/24* (2006.01)

(52) U.S. Cl.
CPC .............. *G03F 7/201* (2013.01); *G03F 7/203* (2013.01); *G03F 7/2004* (2013.01); (Continued)

(58) Field of Classification Search
CPC . G03F 7/201; G03F 7/24; G03F 7/203; G03F 7/2004; G03F 7/2032; H05K 3/0082
See application file for complete search history.

(56) References Cited

U.S. PATENT DOCUMENTS

| 3,981,583 A | 9/1976 | Tsuchida et al. |
| 5,073,792 A | 12/1991 | Paccagnella et al. |
| | (Continued) | |

FOREIGN PATENT DOCUMENTS

| CA | 2374207 C | 10/2009 |
| CN | 1236361 C | 1/2006 |
| | (Continued) | |

OTHER PUBLICATIONS

Columbian Office Action for Columbian Application No. NC2018/0004325, dated Sep. 5, 2019, 21 pages.
(Continued)

*Primary Examiner* — Peter B Kim
(74) *Attorney, Agent, or Firm* — RatnerPrestia

(57) ABSTRACT

The overall mechanism for creating the exposure may comprise a table having an outer frame 1110 that holds a transparent (e.g. glass) inner portion 1112. The upper 1120 and lower 1122 linear radiation sources (e.g. banks of LED point sources, optionally mounted inside a reflective housing) are mounted on a gantry system or carriage 1130. The radiation sources are connected to a power source, such as an electrical power cord having sufficient slack to extend the full range of motion of the carriage. Tracks (not shown) disposed on the outer frame portion provide a defined path for the gantry system or carriage to traverse. The carriage may be moved on the tracks by any drive mechanism known in the art (also coupled to the power supply and the controller), including a chain drive, a spindle drive, gear drive,
(Continued)

or the like. The drive mechanism for the carriage may comprise one or more components mounted within the carriage, one or more components fixed to the table, or a combination thereof. A position sensor (not shown) is preferably coupled to the carriage to provide feedback to the controller regarding the precise location of the carriage at any given time. The control signal output from the controller for operating the radiation sources and for controlling motion of the carriage may be supplied via a wired or wireless connection. The controller may be mounted in a fixed location, such as connected to the table with a control signal cable attached to the sources similar to the power cable, or may be mounted in or on the carriage. The control system and drive mechanism cooperate to cause back/forth relative motion in a transverse direction between the light from the radiation sources and the plate. It should be understood that other embodiments may be devised in which the drive mechanism is configured to move the portion of the table containing the plate past stationary upper and lower linear radiation sources, as well as embodiments in which the radiation sources cover less than the full width of the plate and are movable in both the transverse and longitudinal direction to provide total plate coverage (or the plate is movable in both directions, or the plate is movable in one of the two directions and the sources are movable in the other direction to provides the full range of motion required to cover the entire plate).

49 Claims, 13 Drawing Sheets

Related U.S. Application Data continuation-in-part of application No. PCT/IB2016/001660, filed on Oct. 26, 2016.

(60) Provisional application No. 62/473,784, filed on Mar. 20, 2017, provisional application No. 62/246,276, filed on Oct. 26, 2015.

(52) U.S. Cl.
CPC .............. *G03F 7/2032* (2013.01); *G03F 7/24* (2013.01); *H05K 3/0082* (2013.01)

(56) References Cited

U.S. PATENT DOCUMENTS

| | | |
|---|---|---|
| 5,386,268 A | 1/1995 | Ohlig et al. |
| 6,238,837 B1 | 5/2001 | Fan |
| 6,266,134 B1 | 7/2001 | Gelbart |
| 6,326,127 B1 | 12/2001 | Morren et al. |
| 6,352,815 B1 | 3/2002 | Feil et al. |
| 6,355,395 B1 | 3/2002 | Zwez et al. |
| 6,383,690 B1 * | 5/2002 | Vargas ...................... G03F 1/56 250/208.1 |
| 6,700,598 B1 | 3/2004 | Hull |
| 6,908,726 B2 | 6/2005 | Korionoff et al. |
| 6,903,809 B2 | 7/2005 | Donahue et al. |
| 6,931,992 B1 | 8/2005 | Hull et al. |
| 7,358,026 B2 | 4/2008 | Dudek et al. |
| 7,632,825 B2 | 12/2009 | Roberts et al. |
| 7,682,775 B2 | 3/2010 | Rapp et al. |
| 7,691,550 B2 | 4/2010 | Goldfarb |
| 7,709,183 B2 | 5/2010 | Watanabe et al. |
| 7,767,383 B2 | 8/2010 | Roberts et al. |
| 7,875,321 B2 | 1/2011 | Verhoest et al. |
| 8,034,540 B2 | 10/2011 | Zwadlo |
| 8,114,569 B2 | 2/2012 | Holt |
| 8,153,347 B2 | 4/2012 | Veres et al. |
| 8,227,769 B2 | 7/2012 | Sievers |
| 8,389,203 B2 | 3/2013 | Sievers |
| 8,399,178 B2 | 3/2013 | Bertrand et al. |
| 8,501,391 B2 | 8/2013 | Yoshida et al. |
| 8,524,442 B1 | 9/2013 | Recchia et al. |
| 8,578,854 B2 | 11/2013 | Sievers |
| 8,790,864 B2 | 7/2014 | Baldwin |
| 8,820,234 B2 | 9/2014 | Sievers |
| 8,900,708 B2 | 12/2014 | Savariar-Hauck et al. |
| 8,994,916 B2 | 3/2015 | Mei et al. |
| 9,040,226 B2 | 5/2015 | Boukaftane |
| 9,057,958 B2 | 6/2015 | Armstrong et al. |
| 9,063,426 B2 | 6/2015 | Ramakrishnan et al. |
| 9,134,612 B2 | 9/2015 | Blomquist et al. |
| 9,463,617 B2 | 10/2016 | De Caria |
| 9,671,695 B2 | 6/2017 | Fronczkiewicz et al. |
| 9,703,201 B2 | 7/2017 | Vest et al. |
| 9,740,099 B2 | 8/2017 | Boukaftane |
| 9,740,103 B2 | 8/2017 | Vest |
| 9,849,663 B2 | 12/2017 | Sievers |
| 9,889,640 B2 | 2/2018 | Boyksen |
| 9,937,703 B2 | 4/2018 | Stebani et al. |
| 10,025,183 B2 | 7/2018 | Baldwin et al. |
| 10,036,956 B2 | 7/2018 | Baldwin et al. |
| 10,175,580 B2 | 1/2019 | Fronczkiewicz et al. |
| 10,732,507 B2 * | 8/2020 | Wolterink ................ G03F 7/24 |
| 2002/0192569 A1 | 12/2002 | Ulland et al. |
| 2005/0011382 A1 | 1/2005 | Donahue et al. |
| 2005/0116176 A1 | 6/2005 | Aguirre et al. |
| 2006/0124608 A1 | 6/2006 | Kessenich et al. |
| 2006/0154180 A1 | 7/2006 | Kannurpatti |
| 2007/0071935 A1 | 3/2007 | Lin et al. |
| 2007/0084368 A1 | 4/2007 | Vest et al. |
| 2007/0146430 A1 | 6/2007 | Nakamura et al. |
| 2007/0148582 A1 | 6/2007 | Hayashi et al. |
| 2007/0218372 A1 | 9/2007 | Zalevsky et al. |
| 2008/0063981 A1 | 3/2008 | Ohnishi |
| 2008/0280227 A1 | 11/2008 | Sievers |
| 2009/0186308 A1 | 7/2009 | Rudolph |
| 2009/0267269 A1 | 10/2009 | Lim et al. |
| 2009/0272286 A1 | 11/2009 | Wolterink et al. |
| 2009/0290891 A1 | 11/2009 | Sievers |
| 2010/0028815 A1 | 2/2010 | Zwadlo |
| 2010/0143840 A1 | 6/2010 | Veres et al. |
| 2010/0173135 A1 | 7/2010 | Choi et al. |
| 2011/0104615 A1 | 5/2011 | Sievers |
| 2011/0230585 A1 | 9/2011 | Chen |
| 2012/0157561 A1 | 6/2012 | Gould et al. |
| 2012/0171434 A1 | 7/2012 | Herlihy |
| 2012/0266767 A1 | 10/2012 | Klein et al. |
| 2013/0209939 A1 | 8/2013 | Recchia et al. |
| 2013/0242276 A1 | 9/2013 | Schadebrodt et al. |
| 2013/0340637 A1 | 12/2013 | Wolterink et al. |
| 2014/0057207 A1 | 2/2014 | Baldwin |
| 2014/0335456 A1 | 11/2014 | Boukaftane |
| 2015/0030984 A1 | 1/2015 | Ramakrishnan |
| 2016/0207299 A1 | 7/2016 | Stebani et al. |
| 2016/0368260 A1 | 12/2016 | De Caria |
| 2018/0004093 A1 | 1/2018 | Fronczkiewicz et al. |
| 2018/0210345 A1 | 7/2018 | Wolterink et al. |
| 2018/0217502 A1 | 8/2018 | Dietz et al. |
| 2020/0023632 A1 | 1/2020 | Boyksen |

FOREIGN PATENT DOCUMENTS

| | | | |
|---|---|---|---|
| CN | 101019073 A | 8/2007 | |
| CN | 101772424 A * | 7/2010 | ........... G03F 7/2022 |
| CN | 204679755 U | 9/2015 | |
| CN | 104965390 A | 10/2015 | |
| CN | 205644018 U | 10/2016 | |
| CN | 105637419 B | 3/2018 | |
| DE | 102012109130 A1 | 3/2014 | |
| EP | 1804243 B1 | 7/2007 | |
| EP | 2124104 B1 | 11/2009 | |
| EP | 2508948 A2 | 10/2012 | |
| EP | 3035123 A1 | 6/2016 | |
| EP | 3054352 A1 * | 8/2016 | ........... G03F 7/2016 |
| EP | 3086178 A1 | 10/2016 | |

(56) References Cited

FOREIGN PATENT DOCUMENTS

| | | | |
|---|---|---|---|
| EP | 3086179 A1 | 10/2016 | |
| EP | 3121653 B1 | 1/2017 | |
| EP | 2317387 B1 | 12/2018 | |
| JP | 08305006 A | 11/1996 | |
| JP | 2003154628 A | 5/2003 | |
| JP | 3562865 B2 | 9/2004 | |
| JP | 2010091867 A | 4/2010 | |
| JP | 2011154080 A | 8/2011 | |
| JP | 2012145869 A | 8/2012 | |
| JP | 2013029739 A | 2/2013 | |
| WO | 02093265 A1 | 11/2002 | |
| WO | 2007012023 A2 | 1/2007 | |
| WO | 2008094607 A1 | 8/2008 | |
| WO | 2013156942 A1 | 10/2013 | |
| WO | 2014031146 A1 | 2/2014 | |
| WO | 2014035566 A1 | 3/2014 | |
| WO | 2015044437 A1 | 4/2015 | |
| WO | 2015112478 A1 | 7/2015 | |
| WO | 2017072588 A2 | 5/2017 | |
| WO | 2018096144 A1 | 5/2018 | |
| WO | 2018172374 A1 | 9/2018 | |
| WO | 2019016376 A1 | 1/2019 | |

OTHER PUBLICATIONS

Datasheet—"DuPont Cyrel 1000 ECLF," 2013, 2 pages.
Digital Flexo Platemaking Using Flint Group's nyloflex NExT, downloaded at https:///www.youtube.com/watch?v=fB-eaQleHh8, 2020, 2 pages.
Digital UV Sleeve User Manual, 2012, 42 pages.
DuPont Processing Manual for Cyrel, 1998, 142 pages.
Esko Full HD Flexo 1.1 Standard Operation Procedure, 2013, 35 pages.
Esko, FullHD-Flexo Standard Operation Procedure for Labels, 2014, 38 pages.
Flint Group User's Manual, 2013, 28 pages.
Harri, "Microscopic Studies of the Influence of Main Exposure Time on Parameters of Flexographic Printing Plate Produced by Digital Thermal Method", Microscopy Research Technique, vol. 72, Issue 10, 2009 (abstract only).
International Preliminary Report on Patentability and Written Opinion for International Application No. PCT/EP2018/057060 dated Sep. 24, 2019, 10 pages.
International Preliminary Report on Patentability for International Application No. PCT/IB2016/001660, dated May 1, 2018, 6 pages.
International Search Report and Written Opinion for International Application No. PCT/IB2016/001660, dated Apr. 24, 2017, 7 pages.
International Search Report and Written Opinion for International Application No. PCT/EP2018/057060, dated Jul. 6, 2018, 15 pages.
Japanese Notification of Reason for Rejection for Japanese Application No. 2018-540233, dated Feb. 7, 2019, 5 pages.
Nichia LED Ever Research for a Brighter World Catalogue, 2009, 7 pages.
Sasa et al., "A Novel UV Sensitive Photopolymerization System with Microgel Matrix", Polymers Advance3d Technologies, vol. 5, Issue 2, 1994 (abstract only).
Specifications for Nichia UV LED Cooling Module, Model: NLBU21P02, 12 pages.
Textbook, "Technik des Flexodrucks," 1999, ISBN 3-85599-003-4, 4th Edition, 3 pages.
Tomašegovic et al., "Modification of Flexographic Printing Plate's Surface Properties By Variation of UVC Finishing", Materials Science, 2013 (abstract only).
Tomašegovic, T., "Functional Model of Photopolymer Printing Plate Production Process," Doctoral Thesis, Jan. 1, 2016, 240 pages, University of Zagreb.
Urano et al., "Photopolymerizatian System Thermally Accelerated by a Laser Diode", Journal of Imaging Science and technology, vol. 41, No. 4, 1997 (abstract only).
User's Manual—"Concept 302 ECDLF," Sep. 2014, 41 pages, Glunz & Jensen.
EskoWorld Digital Flexo Plate Room Automation, 2014, 20 pages.
Esko Technical Paper, Flexographic Printing Forms At the Push of a Button, with translation, 2012, 10 pages.
Entire patent prosecution history of U.S. Appl. No. 15/926,616, filed Mar. 20, 2018, entitled, "Method and Apparatus for Exposure of Flexographic Printing Plates Using Light Emitting Diode (LED) Radiation Sources."
European Communication pursuant to Article 94(3) for European Application No. 18 713 604.9, dated May 26, 2021, 7 pages.
European Communication for European Application No. 16 816 384.8, dated Jan. 25, 2021, 11 pages.
Extended European Search Report for European Application No. 20 209 977.6, dated Jan. 29, 2021, 9 pages.
Indian Examination Report for Indian Application No. 201847014990, dated Jun. 12, 2020, with translation, 5 pages.
Chinese Office Action for Chinese Application No. 201880033332.6, dated May 19, 2021 with translation, 14 pages.
Extended European Search Report for European Application No. 21165620.2, dated Jul. 20, 2021, 8 pages.

* cited by examiner

| | | | | | |
|---|---|---|---|---|---|
| Time delay between back exposure and main exposure (s) | 0 | 48 | 92 | 480 | 1500 |
| Smallest processed single element structure number on printing plate | 64 | 64 | 64 | 144 | 144 |
| Dot top diameter of smallest processed single element on printing plate (μm) | 55.89 | 65.3 | 69.43 | 100.5 | 100 |
| Dot ground diameter of smallest processed single dot element on printing plate (μm) | 538.62 | 559.15 | 573.33 | 491.23 | 350.41 |
| Smallest printed dot diameter on substrate (μm) | 39.5 | 37.1 | 29 | 66 | 72.7 |
| Single element dot shape on processed photosensitive printing plate | 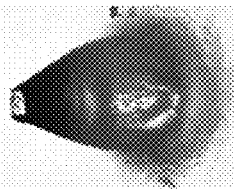 | 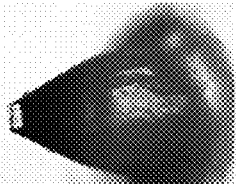 | 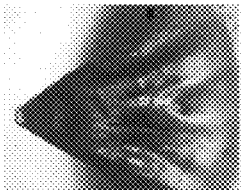 | 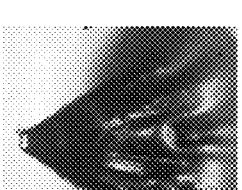 | 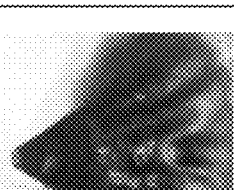 |
| Smallest printed dot diameter on substrate (μm) | 39.5 | 37.1 | 29 | 66 | 72.7 |
| Single element dot size printed on printing substrate |  |  |  |  |  |

FIG. 4

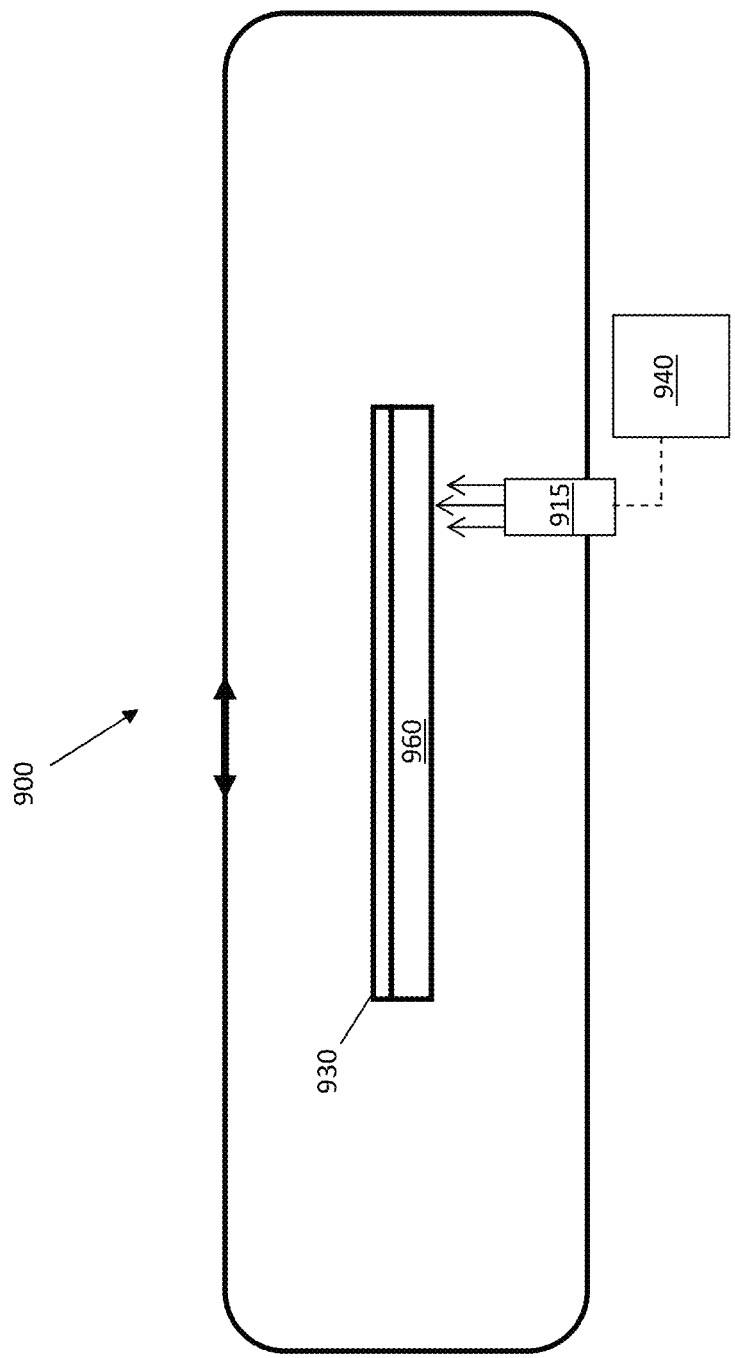

METHOD AND APPARATUS FOR EXPOSURE OF FLEXOGRAPHIC PRINTING PLATES USING LIGHT EMITTING DIODE (LED) RADIATION SOURCES

CROSS-REFERENCE TO RELATED APPLICATIONS

This application is a continuation of U.S. patent application Ser. No. 15/926,616, titled PROCESS AND APPARATUS FOR CONTROLLED EXPOSURE OF FLEXOGRAPHIC PRINTING PLATES AND ADJUSTING THE FLOOR THEREOF, filed Mar. 20, 2018, which is a continuation-in-part of PCT Application Ser. No. PCT/IB2016/001660, titled SYSTEM AND METHOD FOR CONTROLLED EXPOSURE OF FLEXOGRAPHIC PRINTING PLATES, filed 26 Oct. 2016, which claims priority to U.S. Provisional Patent Application Ser. No. 62/246,276, filed on 26 Oct. 2015. This application also claims priority to U.S. Provisional Application Ser. No. 62/473,784, titled "PROCESS AND APPARATUS FOR ADJUSTING THE FLOOR OF A FLEXOGRAPHIC PRINTING PLATE IN A CONTROLLED EXPOSURE SYSTEM OR PROCESS," filed 20 Mar. 2017. All of the foregoing are incorporated herein by reference in their entireties.

BACKGROUND OF THE INVENTION

Many processes are known in the art for preparing polymer printing plates, such as photopolymer flexographic plates and letterpress printing plates coated with photopolymer material. One known process starts with a plate having an ablatable material thereon, imaging the plate in a digital imager to ablate the ablatable material according to imaging data, and then curing the exposed plate by exposure of the plate to radiation, such as light energy, including but not limited to ultraviolet (UV) light energy.

Various processes for curing the plate on both the imaged side and the back side of the plate by exposure to a functional energy source are known, including methods for providing a blanket exposure (such as with fluorescent light tubes that emit UV light), and methods for providing the desired radiation using light emitting diode (LED) technology, such as is described in U.S. Pat. No. 8,389,203, assigned to the assignee of the present application and incorporated by reference. One particularly useful LED arrangement is shown and described in U.S. Pat. No. 8,578,854, also incorporated herein by reference.

Known processes include exposing the back of a plate, then performing laser ablation on the front side of the plate, then performing front side exposure. Other processes include laser ablating the front side of the plate, then curing one side of the plate using a blanket exposure, manually flipping the plate, and then curing the other side of the plate. Each of the foregoing processes interposes an undefined, variable time delay between the first and second exposure, depending upon the amount of time for the laser ablation step in the first process, or depending upon the time it takes to manually flip the plate, in the second. This variability in elapsed time between first and second exposure leads to undesirable variability in plate quality. Still other processes may include exposing both the back side and the front side of a plate simultaneously, which although it produces more predictable results than a process that imposes a variable time delay, is still not optimal, as discussed more herein later.

In the field of printing, minimizing the size of a dot printed on a substrate is desirable, but smaller dots correspond to smaller printing plate elements, which are more susceptible to damage during use. Accordingly, there is always a need in the art to reduce the size or printed dots, while also providing optimal stability of the printing elements on the plate for making those printed dots.

BRIEF DESCRIPTION OF DRAWINGS

FIG. 4 is a table showing and depicting with photographs resulting dot diameters corresponding to 64-pixel and 144-pixel single element structures exposed at various time delays from 0 to 1500 seconds. Numbers in this table use a comma as the decimal mark symbol to separate the integer portion from the fractional portion of non-whole numbers.

FIG. 9 is a schematic drawing depicting an apparatus featuring a single linear radiation source for the front and back and front exposure of a photosensitive printing plate in accordance with aspects of the invention.

SUMMARY OF THE INVENTION

Figure 1A:
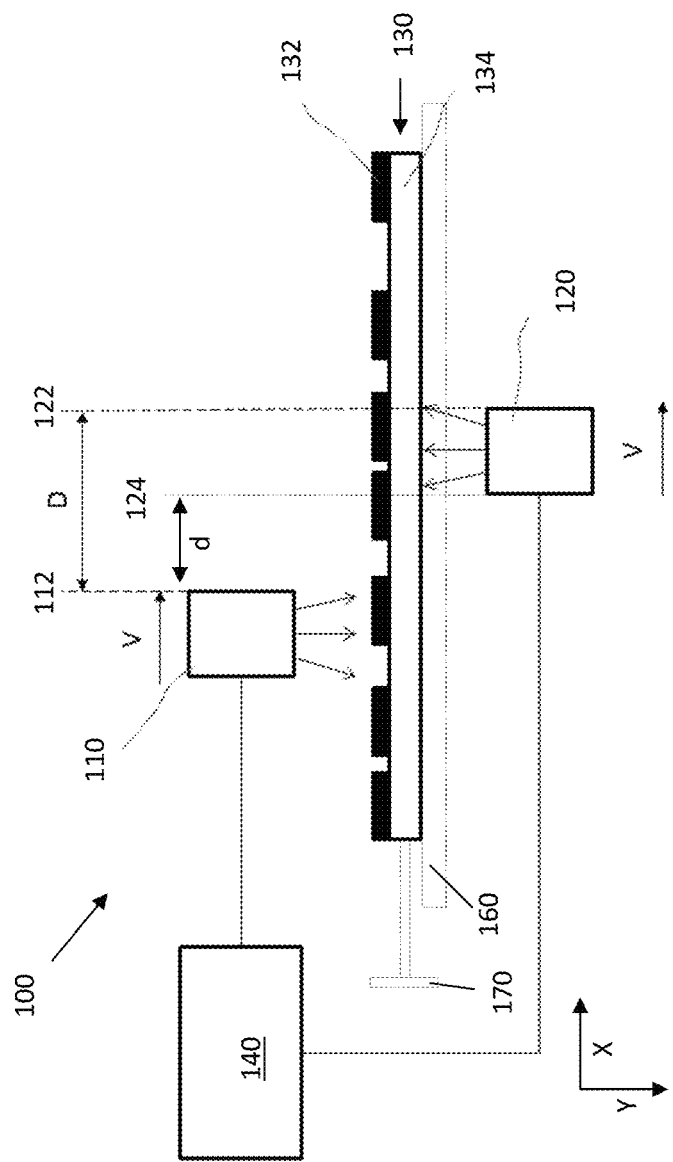
FIG. 1A is a schematic drawing depicting an exemplary apparatus for the back exposure of a photosensitive printing plate in accordance with aspects of the invention.

One aspect of the invention comprises an apparatus for preparing a printing plate, the apparatus comprising a plurality of radiation sources configured to emit the actinic radiation, each of the radiation sources comprises a light emitting diode (LED), such as an LED sources configured to emit actinic ultraviolet (UV) radiation. The plurality of radiation sources includes one or both of a set of front LED sources positioned to emit radiation toward the front side of the plate, with the plate disposed in a stationary position, and a set of back LED sources positioned to emit radiation toward the back side of the plate. The plurality of front LED sources together define a collective irradiation field covering an area at least coextensive with the lateral length and lateral width of the plate, and the plurality of back LED sources together define a collective irradiation field covering an area at least coextensive with the lateral length and lateral width of the plate. One or both of the sets of front and back LED sources may be stationary. A controller is connected to the plurality of radiation sources and configured to activate the plurality of radiation sources to emit the actinic radiation in a predetermined pattern that includes a time difference between activation of at least a portion of the set of back LED sources and activation of at least a portion of the set of front LED sources. A holder may be configured to receive the printing plate in the stationary position to receive incident radiation from the plurality of radiation sources. The holder may comprise a material that transmits the actinic radiation, such as a horizontal surface relative to a ground on which the apparatus is disposed of a holder that defines a cylindrical surface. In another embodiment, the holder may be configured to hold the plate in a vertical orientation relative to a ground on which the apparatus is disposed. The apparatus of may include optics, such as mirrors, for directing and/or confining the radiation emitted from each set of LED sources.

The predetermined pattern may include all of the set of front LED sources emitting actinic radiation simultaneously, all of the set of back LED sources emitting actinic radiation simultaneously, or a combination thereof. The predetermined pattern may include a time difference between activation of at least a portion of the set of back LED sources and activation of at least a portion of the set of front LED sources. The plurality of radiation sources may be individually controllable or controllable in subsets smaller than an entirety of the collective irradiation field corresponding to each set. The predetermined pattern may comprise a sequence that mimics relative motion between the irradiation field and the plate. The predetermined pattern may preclude simultaneously irradiating the front and the back of the plate by respective LEDs spatially aligned with one another relative to a same cross-sectional coordinate of the plate. The predetermined pattern may include activation of multiple portions of the set of front LED sources and the set of back LED sources simultaneously, such as in a pattern that mimics multiple carriages. The predetermined pattern may include activation of all of the plurality of back LED sources simultaneously and then all of the plurality of front LED sources simultaneously, with a predetermined time delay applied between each front and back exposure. The predetermined pattern may include providing a plurality of exposure steps at an intensity that is less than a full amount of actinic radiation required to cure a corresponding side of the plate to a desired degree of curing.

The apparatus may be configured to deliver a first radiation intensity in one exposure step and a second, lesser exposure intensity in another exposure step. The first radiation intensity and the second, lesser exposure intensity may be delivered with the same set of LED sources. The set of front LED sources has a first nominal radiation intensity and the set of back LED sources has a second nominal radiation intensity. The predetermined pattern includes activation of the back LED sources at the second nominal radiation intensity in one exposure step, and activation of the back LED sources at a radiation intensity less than the second nominal intensity another exposure step.

Each set of LED sources comprises a plurality of discrete arrays having a plurality of individual LED point sources on each array, with the plurality of LED point sources arranged in a plurality of lines. The plurality of LED point sources on each array may be controllable together, individually controllable, or controllable in groups, such as each line of LED point sources in each array being separately controllable. The radiation intensity generated by at least one line of LED point sources may differ from a corresponding radiation intensity generated by at least one other line of LED point sources for a same amount of input energy, wherein the controller is configured to control the radiation intensity produced by each line to achieve an intended degree of homogeneity.

Another aspect of the invention comprises a method for calibrating the apparatus as described herein by periodically characterizing radiation intensity generated by a plurality of lines of LED point sources and adjusting input energy to the respective plurality of lines of LED point sources to account for variations in the lines over time. The characterization may be performed by positioning a sensor that measures incident radiation at a predetermined distance from each line of LED sources. The method may include tailoring radiation intensity of one or more groups of the LED point sources to compensate for variations in transmissivity of a structure that lies between the sources and the printing plate.

Still another aspect of the invention comprises a method for exposing a photopolymer printing plate to actinic radiation from a UV LED light source, the photopolymer printing plate having a non-printing back side and a printing front side with a mask for defining an image to be printed. The method comprises the steps of (a) positioning the photopolymer printing plate in an exposure unit, wherein the exposure unit comprises a plurality of UV LED radiation sources; and (b) exposing the photopolymer printing plate through the mask to actinic radiation from the plurality of UV LED light sources to cure a portion of the photopolymer in the plate in an exposure step during which the plurality of UV LED radiation sources and the photocurable printing plate do not move relative to each other. A first exposure intensity is provided in one exposure step and a second, different exposure intensity is provided in another exposure step. Where the exposure unit has optics, including mirrors, the exposure step may comprise directing the radiation emitted from the plurality of UV LED radiation sources with the mirrors. The plurality of UV LED radiation sources may comprise one or more sets of LED sources, each set of LED sources together defining a collective irradiation field covering an area at least coextensive with a lateral length and lateral width of the plate. The plurality of UV LED radiation sources emit the actinic radiation at a first intensity, wherein the actinic radiation reaching a photocurable surface of the printing plate may be less than the first intensity, such as wherein a portion of the actinic radiation emitted by the plurality of UV LED radiation sources is not transmitted by a surface on which the plate is mounted, blocked by a substrate on which the photocurable polymer is disposed, or a combination thereof.

The first exposure intensity may be provided in one or more back exposure steps and the second exposure intensity may be provided in one or more front exposure steps. The method may include performing the first exposure step with the plurality of UV LED light sources emitting at a nominal intensity, and the second exposure step with the plurality of UV LED light sources emitting at less than the nominal intensity. The first exposure step and the second exposure step may both be back exposure steps. The method may comprise providing a plurality of back exposure steps including at least a first back-only exposure step and a second back exposure step followed by a predetermined time delay followed by a front exposure step, including adjusting the intensity of the one or more of the plurality of UV LED light sources in at least one of the back exposure steps to provide a predetermined ratio Rbf between front side and back side exposure of the printing plate.

DETAILED DESCRIPTION OF THE INVENTION

Those of skill in the art understand that oxygen is distributed throughout the photopolymer resin of a polymer plate at the time it is typically processed, and that oxygen is an inhibitor of the polymerization reaction commonly harnessed for curing the plates. Although polymerization caused by exposure of the polymer to actinic radiation scavenges this distributed oxygen, ambient oxygen will diffuse back into the resin over time if the plate is in contact with atmospheric air. Surprisingly, in processes in which a back exposure and main exposure are both performed on a plate, it has been found that fine detail on a plate may be optimized by imparting a defined delay between performing the back exposure and the main exposure. Without being held to any particular mechanism, it is believed that in this defined delay time following the back exposure, which scavenges oxygen from the back portion of the plate, oxygen from the front side of the plate starts to diffuse to the back side, thus creating a slightly less oxygen rich concentration in the area of the plate nearest the floor of the plate, such that the polymerization reactions near the floor of the plate react for longer before stopping and therefore create shapes on the plate that taper from the floor toward the top of the plate following the main exposure. It should be noted that a delay that is too long will reset the entire plate to being oxygen saturated, and a delay that is too short may not permit sufficient oxygen diffusion to produce optimal results. Thus, while the amount of the optimal delay may vary depending on any number of characteristics, what is important is that the delay not be too long or too short, for optimal results. This delay may be imparted in any number of ways, described in more detail herein.

An exemplary apparatus 100 for the back exposure of photosensitive printing plate 130 is shown schematically in FIG. 1. As is well known in the art, printing plate 130 comprises a photosensitive polymer 134 on which is disposed a mask 132 that defines portions of the plate that are masked from radiation exposure relative to portions of the plate that are desired to receive such exposure. In a typical embodiment, the polymer 134, including in the mask 132 area, is permeable to oxygen.

In apparatus 100, a UV source of actinic radiation 120 with a predetermined power density is scanned at a specific speed (v) under the bottom of the plate. For the main or front exposure of the photosensitive printing plate a second UV source of radiation 110 with a predetermined power density (irradiance) is scanned above the plate with the same specific speed (v). UV sources of radiation 110 and 120 are configured to scan the printing plate with the same speed (v). Such a configuration may be provided by synchronizing sources 110 and 120 to have a same speed using a controller, or both sources may be attached to a common carriage that traverses the plate, with sources 110 and 120 spaced apart from one another a suitable distance in the direction of carriage travel to provide the desired delay when the carriage moves at a predetermined speed. The predetermined irradiance may be the same for the main side and the back side, or may be different. Preferably the irradiance at the rear side is only a fraction of the irradiance of the front side exposure. Typically, the irradiance at the rear side is in a range of 10% or less of the front side irradiance, but the invention is not limited to any particular ratio of front to back irradiance. The predetermined irradiance is typically a function of the characteristics of the specific type of plate to be exposed, as is known to those of skill in the art, and as is dictated by the manufacturers of such plates.

Figure 7:
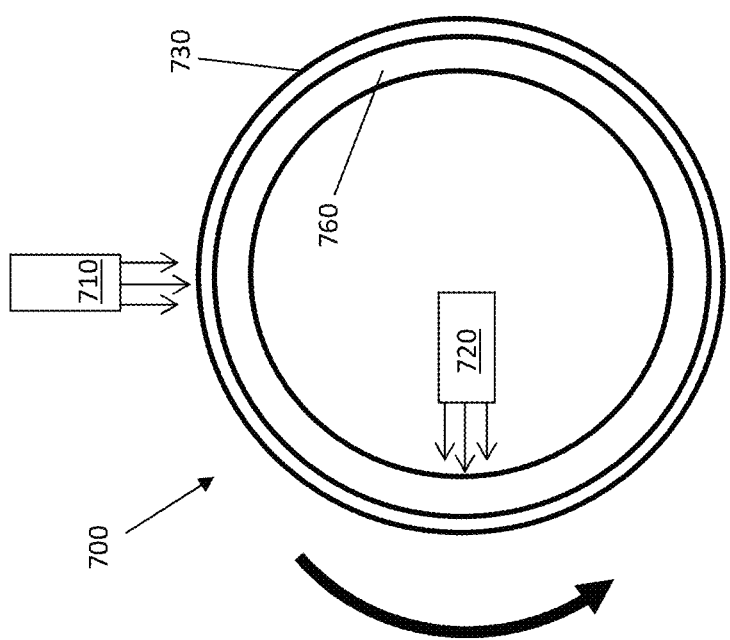
FIG. 7 is a schematic drawing depicting an apparatus having a cylindrical configuration for the front and back exposure of a photosensitive printing plate in accordance with aspects of the invention.

The time delay between the back exposure with UV source of radiation 120 and the main exposure with UV source of radiation 110 may be adjusted by the control system 140 by adjusting the speed of the sources and/or mechanically by setting a constant distance (D) between the sources during the scan process. The time delay t=D/v. Thus, mechanically varying D has an impact on the delay, as does the relative speed between the plate and the sources during exposure. The time delay can be optimized to get smaller single dot elements on the photosensitive printing plate after processing and smaller single element dot sizes printed on the print substrate. It should be understood that the arrangement depicted in FIG. 1 is schematic in nature only, to show the relationship between the light sources and the distance D relative to a plate. In a system 100 in which printing plate 130 is disposed along a horizontal plane (i.e. in which directional arrow Y of the X-Y axis shown in FIG. 1 represents the directional pull of gravity), plate 130 may be mounted on a transparent substrate 160 (such as glass). In a system 100 in which printing plate 130 is disposed along a vertical plane (i.e. a system in which directional arrow X of the X-Y axis represents the directional pull of gravity), the plate may be hung vertically (such that no substrate under the plate or other structure between the radiation source and the plate are required), such as from a hanger 170. It should be understood that hangar 170 as depicted in FIG. 1 is intended only to be schematic, and is not intended to represent any particular hangar geometry. Furthermore, although shown in a flat orientation, it should be understood that the printing plate may be flexible enough to be disposed around a transparent cylinder, such as a glass cylinder, or the plate may be in the form of a continuous sleeve, as is known in the art, with the distances between the light sources arranged relative to the rotational direction of the cylinder, as generally depicted in FIG. 7 and described in more detail herein later.

The relative movement between the radiation sources and the plate may be provided by any mechanism known in the art for moving objects relative to a horizontal, vertical, or otherwise disposed stationary surface. For configurations in which the radiation sources move and the plate is stationary, for example, the sources may be disposed on a gantry system having arms that pass the respective sources above and beneath a stationary horizontal plate mounted on a substrate configured to permit a sufficient amount of radiation to pass through, or on either side of a vertically mounted plate. For configurations in which the radiation sources are stationary and the plate is movable, for example, the plate may be mounted on any mechanism known in the art, such as a movable stage configured to move relative to fixed sources on opposite sides of the stage. Mechanisms for rotating a cylinder on which a plate is mounted relative to fixed sources are well known in the field of printing. Similarly, mechanisms for rotating sources relative to a fixed cylinder on which a stationary object is mounted are also well known, such as in the field of medicine (e.g. CAT scan machines). Thus, mechanisms for moving one or more elements relative to another are well known in the art, generally, and the invention is not limited to any particular mechanism.

As shown in FIG. 1, it should be understood that each of the front source 110 the back source 120 have an irradiation field covering an area at least coextensive with a width of the plate (wherein the "width" lies along the third dimension not shown in the 2-dimensional image of FIG. 1) but not coextensive with a full length of the plate (wherein the "length" lies along the X-axis as shown in FIG. 1). Each of the front source and the back source may thus comprise a linear source (such as sources 1120 and 1122 shown in FIG. 11) that emits radiation along a line parallel to the width of the plate. Each linear source, however, may comprise a plurality of subsources (such as LED point sources 1212 shown in FIG. 12) that together collectively create the linear radiation field having a defined length less than the length of the printing plate, and a width that spans at least the entire width of the printing plate.

Figure 11:
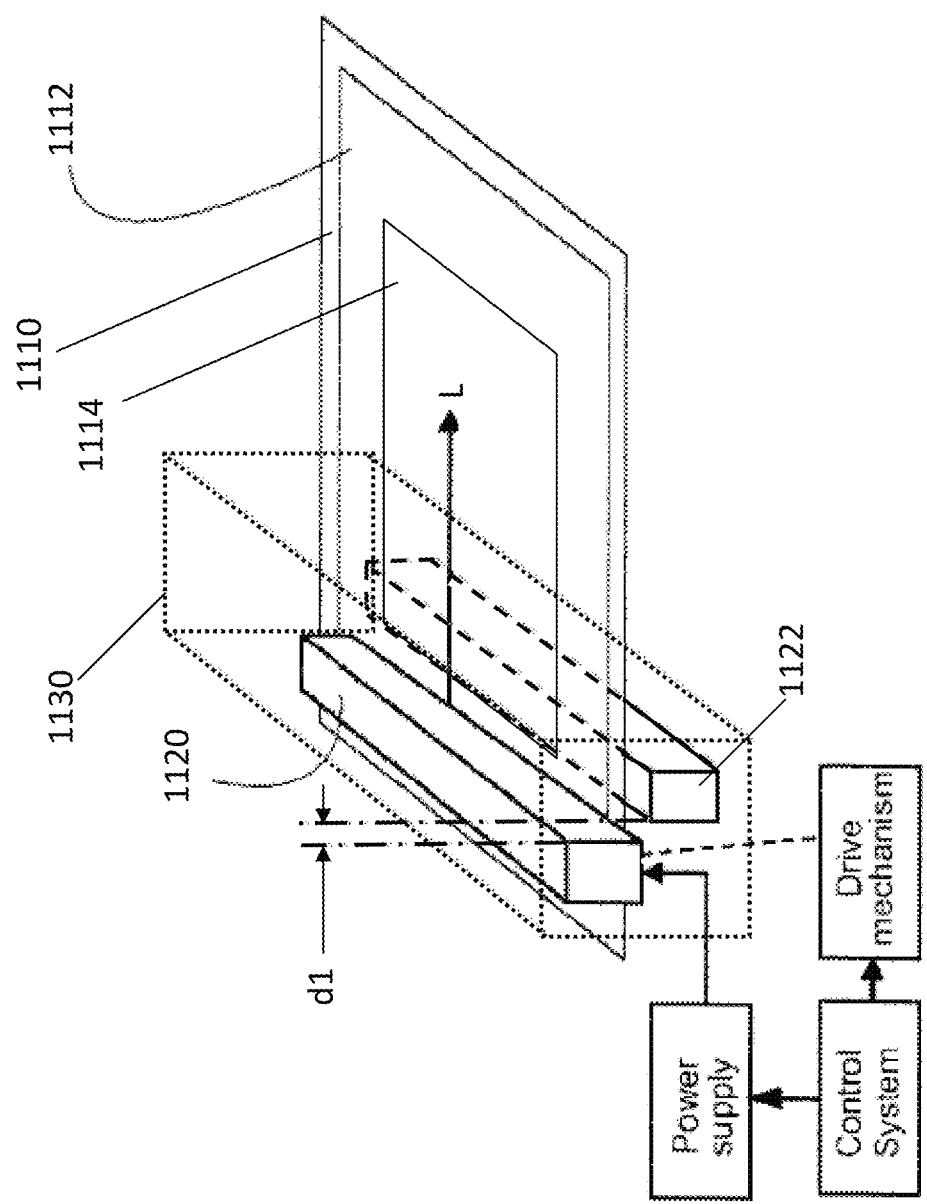
FIG. 11 is a schematic illustration depicting a flatbed embodiment of the invention.
Figure 12:
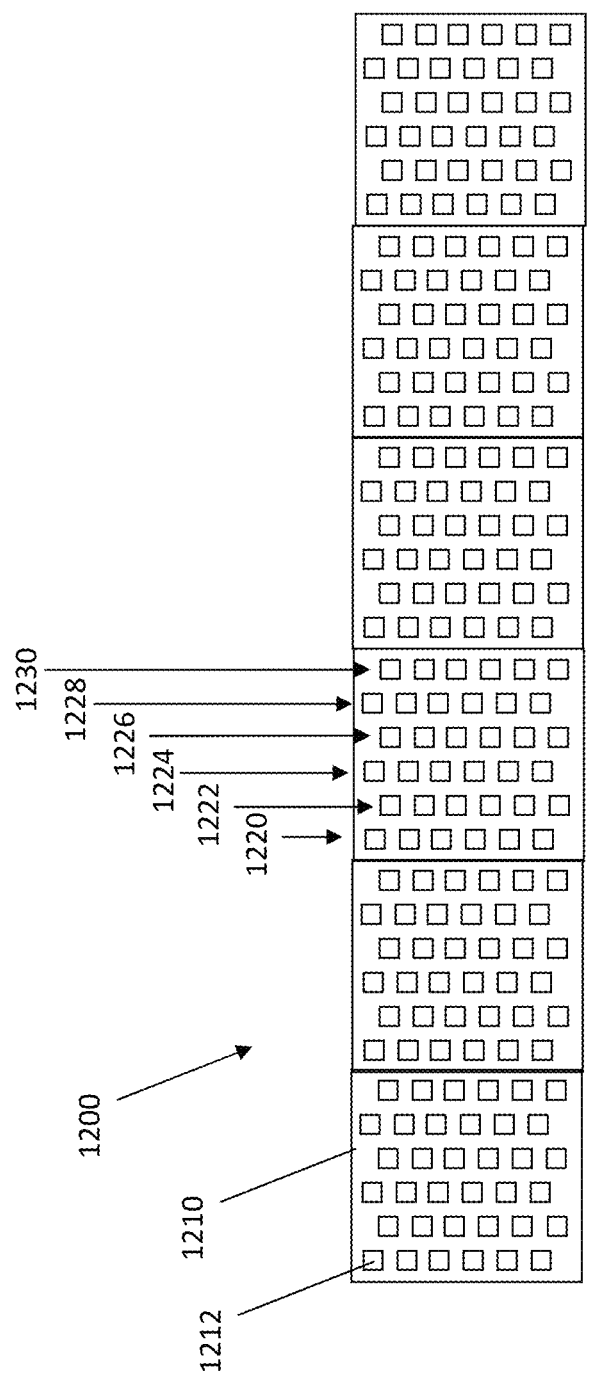
FIG. 12 is a schematic illustration of a light source embodiment comprising a plurality of units having a plurality of rows of point sources.

In one embodiment, shown in FIG. 11, carriage 1130 may comprise a first linear source 1122 arranged to irradiate the back side of a plate 1114 mounted on transparent surface 1112, such as a glass plate, and a second linear source 1120 arranged to irradiate the top side of the plate. Each linear source extends to cover one dimension of the plate, which in the example shown shall be referred to as the transverse direction. The carriage traverses the plate in the longitudinal (or lateral) direction along arrow L, with at least one source, and preferably both sources, activated. While the exposure step may be performed in a single pass, in some embodiments the exposure may be performed in a plurality of passes, in which each pass imparts radiation using both banks of sources at a fraction of the total exposure needed to provide a desired amount of exposure. As will be understood, the carriage may have a first speed when traversing the plate along the direction of arrow L with radiation sources activated, and a second, faster speed when traversing the plate in the direction opposite arrow L, to reset for another pass or at the completion of the desired number of passes.

The overall mechanism for creating the exposure may comprise a table having an outer frame 1110 that holds a transparent (e.g. glass) inner portion 1112. The upper 1120 and lower 1122 linear radiation sources (e.g. banks of LED point sources, optionally mounted inside a reflective housing) are mounted on a gantry system or carriage 1130. The radiation sources are connected to a power source, such as an electrical power cord having sufficient slack to extend the full range of motion of the carriage. Tracks (not shown) disposed on the outer frame portion provide a defined path for the gantry system or carriage to traverse. The carriage may be moved on the tracks by any drive mechanism known in the art (also coupled to the power supply and the controller), including a chain drive, a spindle drive, gear drive, or the like. The drive mechanism for the carriage may comprise one or more components mounted within the carriage, one or more components fixed to the table, or a combination thereof. A position sensor (not shown) is preferably coupled to the carriage to provide feedback to the controller regarding the precise location of the carriage at any given time. The control signal output from the controller for operating the radiation sources and for controlling motion of the carriage may be supplied via a wired or wireless connection. The controller may be mounted in a fixed location, such as connected to the table with a control signal cable attached to the sources similar to the power cable, or may be mounted in or on the carriage. The control system and drive mechanism cooperate to cause back/forth relative motion in a transverse direction between the light from the radiation sources and the plate. If should be understood that other embodiments may be devised in which the drive mechanism is configured to move the portion of the table containing the plate past stationary upper and lower linear radiation sources, as well as embodiments in which the radiation sources cover less than the full width of the plate and are movable in both the transverse and longitudinal direction to provide total plate coverage (or the plate is movable in both directions, or the plate is movable in one of the two directions and the sources are movable in the other direction to provides the full range of motion required to cover the entire plate).

In one work flow configuration, the table for conducting the exposure step (i.e. exposure table) as described above may be positioned to automatically receive an imaged plate from an imager. For example, an imager may be positioned so that the imaged plate expelled therefrom lands in a first location, and a robotic handling device may be configured to automatically pick up and move the imaged plate from the first location to a processing location on the exposure table, where the exposure process as described herein is then performed using transverse linear sources attached to a carriage that traverses the plate longitudinally.

As discussed in U.S. Pat. No. 8,578,854 and illustrated schematically in FIG. 12, each bank 1200 of LED sources may comprise a plurality of discrete units 1210 having a plurality of individual LED point sources 1212 on each unit, with the plurality of point sources arranged in a plurality of lines 1220, 1222, 1224, 1226, 1228, 1230. All of the point sources on each unit may be controlled together, may be individually controlled, or may be controlled in groups. For example, each line of point sources in each unit (e.g. each of lines 1220, 1222, 1224, 1226, 1228, 1230) may be separately controllable. Providing such a fine level of control may have several advantages. For example, the actual output from each line of LEDs may vary slightly for the same amount of input energy, due to variations in the LEDs themselves, soldering to the circuit board, cooling, decay or wear over time, and the like, and thus, each line of LEDs may be characterized and their intensity varied by an appropriate factor relative to other lines to so that the radiation output produced by each line is as close to homogenous as possible. Characterizations and re-calibration may be performed on a periodic basis to account for variations in the lines over time. Such characterizations may be performed by positioning a sensor that measures incident radiation at a predetermined distance from each line of LED sources. On top of compensation for variations in the output intensity of the LEDs themselves, further compensations may be made for variations in transmissivity of any structure that lies between the sources and the printing plate, such as for example, the glass surface 1112 that lies between the back sources and the printing plate in the configuration shown in FIG. 11. Any characterizable variations in transmissivity of emitted radiation through the glass surface can be countered by varying the intensity of the LEDs based upon carriage location so that the amount of radiation that reaches the back of the plate is as close to homogenous as possible over the entire exposed plate area.

DEFINITIONS

Figure 2B:
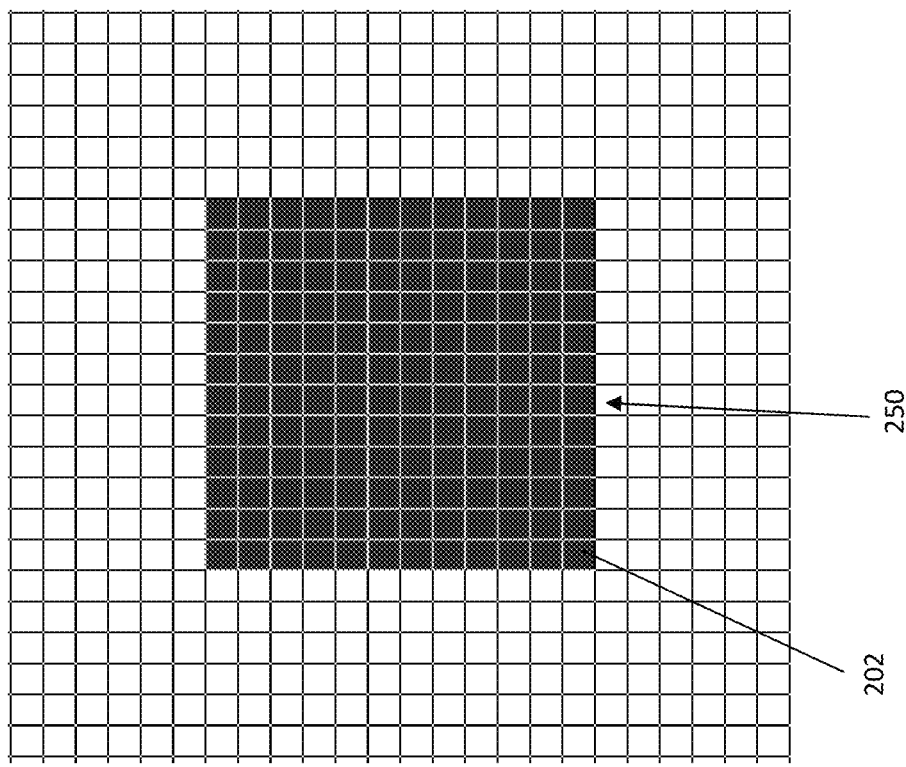
FIG. 2B depicts a "single element number 144" as referred to herein, comprising 12 by 12 single pixels.
Figure 2A:
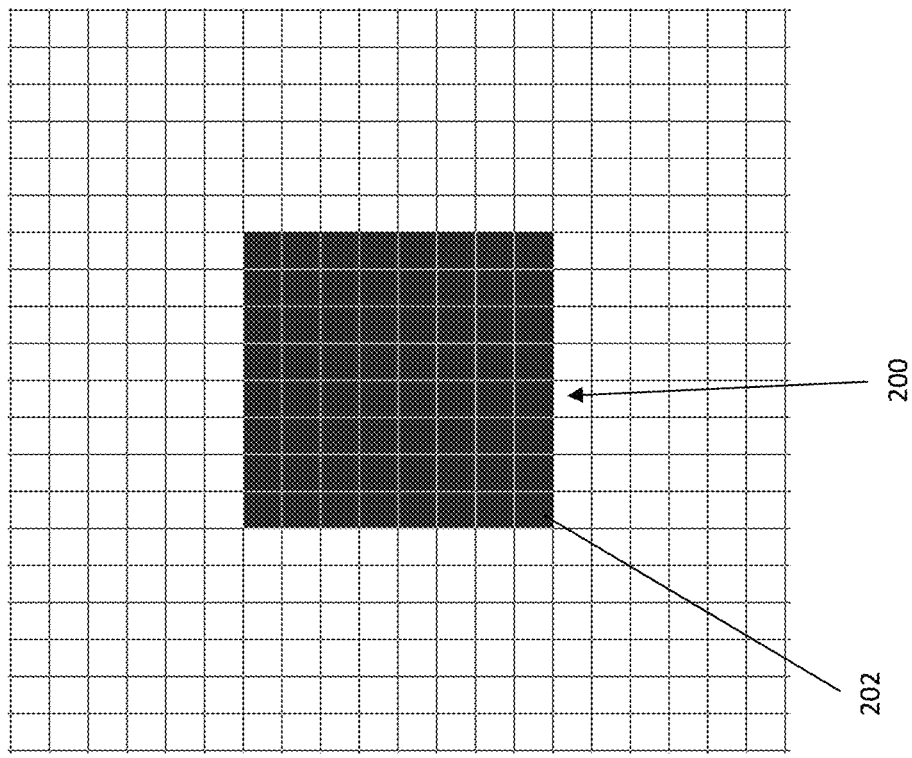
FIG. 2A depicts a "single element number 64" as referred to herein, comprising 8 by 8 single pixels.

The term "single element structure number" as used herein refers to a square defined by the total number of pixels that comprises that square. For example, a "64-pixel single element structure" comprises square 200, which comprises an 8×8 grid of pixels 202, and has a total of 64 pixels, as illustrated in FIG. 2A. Likewise "144-pixel single element structure" 250 comprises a grid of 12×12 pixels 202, yielding a total of 144 pixels, as illustrated in FIG. 2B.

Figures 3A, 3B, 3C:
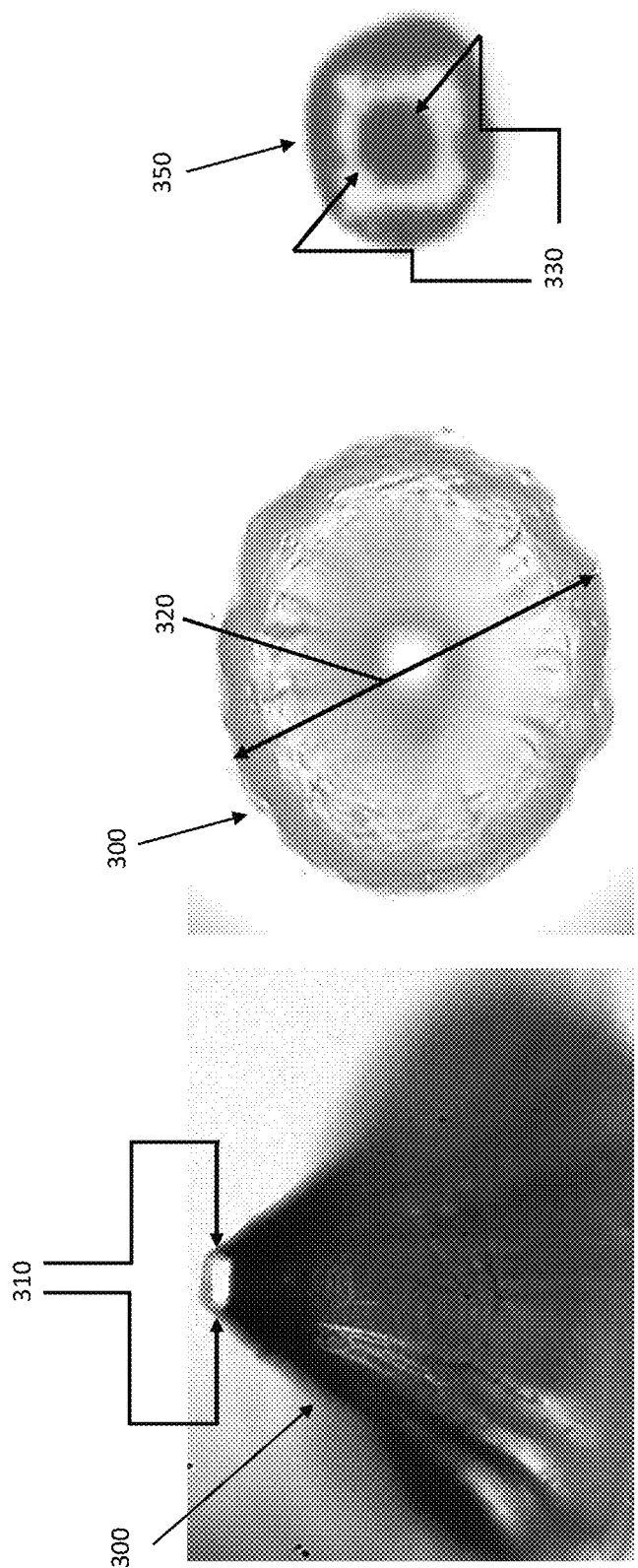
FIG. 3A is a photograph of a 3D perspective side view of an exemplary printing plate element.
FIG. 3B is a photograph of a top view of the exemplary printing plate element of FIG. 3A.
FIG. 3C is a photograph of a top view of a dot printed on a substrate by the printing plate element of FIG. 3A.

The term "dot top diameter" refers to the diameter of the top of a printing plate element or "dot" (i.e. the portion of the element that contacts the printing surface), as illustrated in FIG. 3A, showing a photograph of a 3-dimensional perspective side view of an exemplary printing plate element 300 and its dot top diameter 310. The term "dot ground diameter" refers to the diameter at the base of a printing plate element or "dot" (i.e. the diameter of the element at the floor or "ground" of the plate), as illustrated in FIG. 3B, which is a photograph of a top view of exemplary printing plate element 300 and its dot ground diameter 320. The term "printed dot diameter" refers to the diameter of the dot that is printed on a substrate by a printing element, as illustrated in FIG. 3C, which is a photograph of a top view of printed dot 350 and its printed dot diameter 330.

EXAMPLE

For optimization of the time delay, single element structures of various sizes were imaged by a laser into the mask of a photosensitive printing plate at a resolution of 4000 dpi. For this example, a Model No. DPR 045 printing plate, manufactured by DuPont, was used.

The photosensitive printing plates were then back exposed, such as by using UV radiation source 120, and main exposed, such as by using UV radiation source 110, as depicted in FIG. 1. For this example, each source 120 and 110 source comprised a linear source comprising a bank of individual LED UV point sources, as described in more detail herein. The plate was exposed in a single exposure step using a main side UV irradiance of 230 mw/cm$^2$ at a wavelength of 360 nm and a back side UV irradiance of 17 mw/cm$^2$ at the same wavelength at a relative plate speed of 1.25 mm/sec. For this example, the UV radiation sources were moved lengthwise under and above the surface of each photosensitive printing plate at the specified speed. The time delay was varied to optimize the smallest single dot element on the processed photosensitive printing plate and printed to optimize the smallest printable dot size on the printing substrate.

Figure 5:
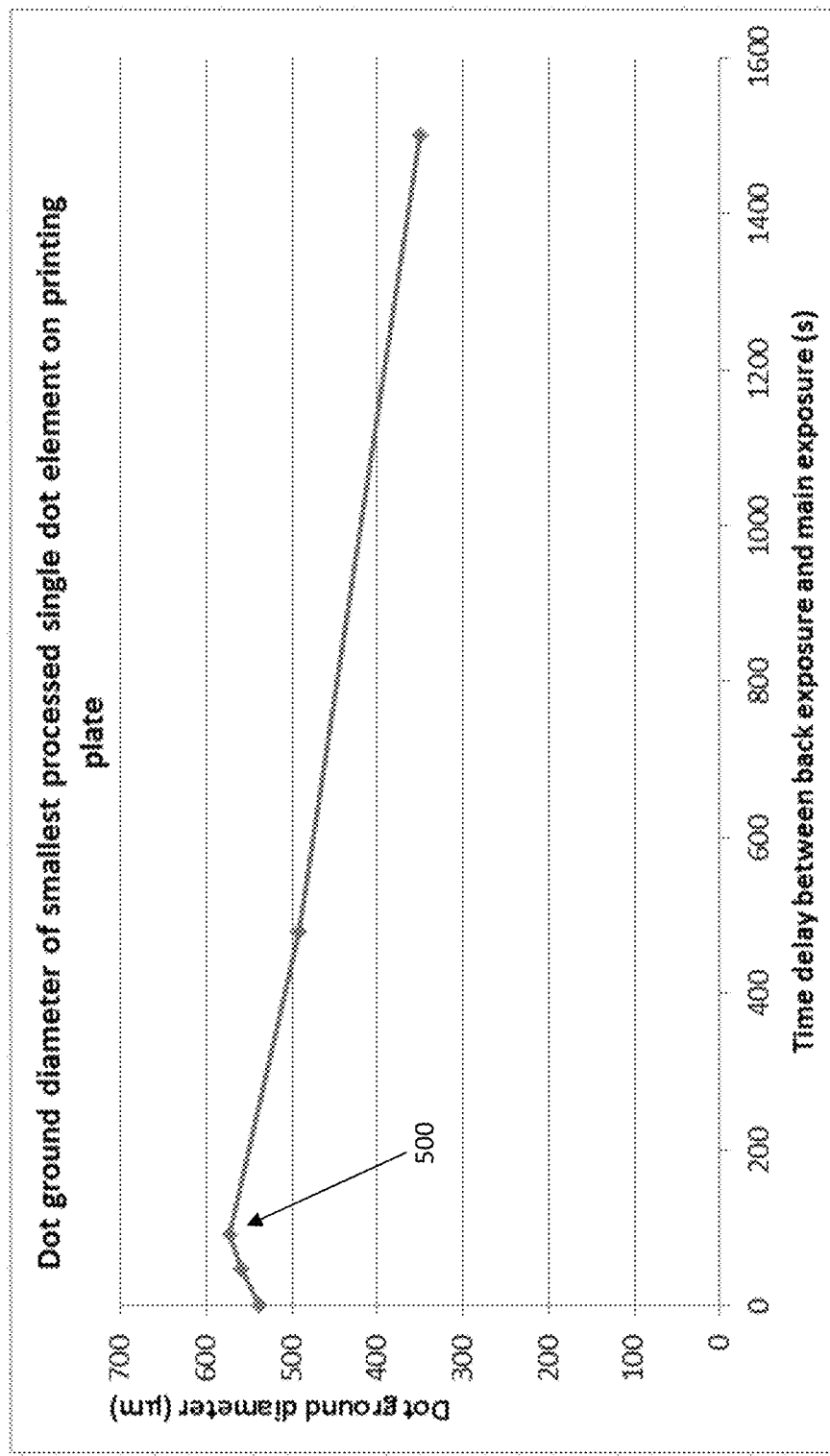
FIG. 5 is a graph corresponding to the results of FIG. 4, illustrating the dot ground diameter for the smallest processed single dot element on a printing plate versus time delay between back exposure and main exposure for an exemplary set of processing conditions.
Figure 6:
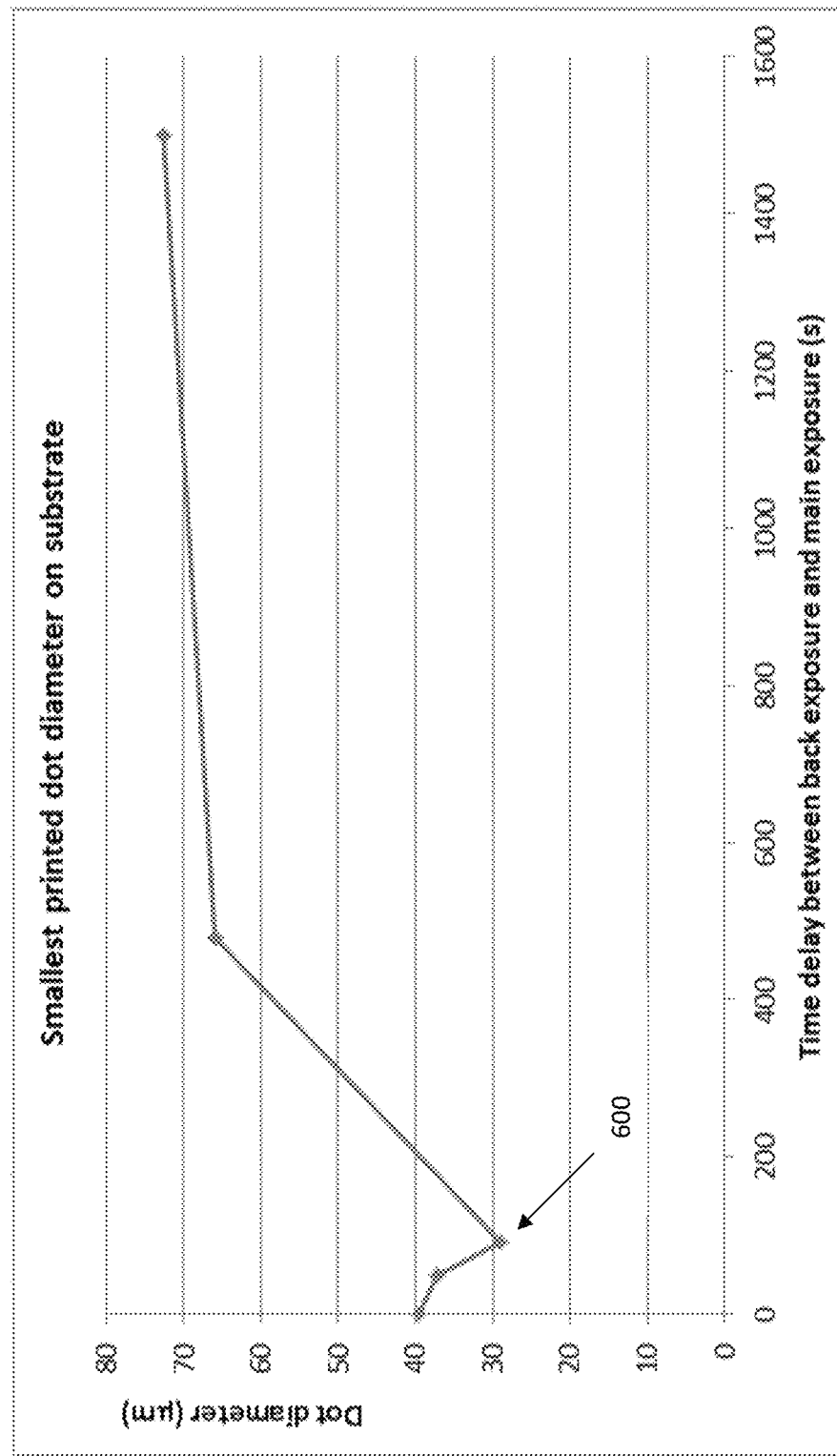
FIG. 6 is a graph corresponding to the results of FIG. 4, illustrating the smallest printed dot diameter versus time delay between back exposure and main exposure for an exemplary set of processing conditions.

Results of exemplary time delays for exemplary single element structure numbers 64 and 144 are shown in FIGS. 4-6. As shown in FIG. 5, a plot of the ground diameter of the smallest processed single dot element versus the time delay between back exposure and main exposure for any set of conditions yields a maximum 500 (i.e. 573.33 μm diameter at 92 seconds time delay, for the plot shown). Thus, the size of the base of the dot, and therefore the stability of the shape, can be optimized by optimizing the time delay between back exposure and main exposure. As shown in FIG. 6, a plot of the smallest printed dot on the substrate versus the time delay between back exposure and main exposure yields a minimum 600 (29 μm diameter at approximately 92 seconds time delay, for the plot shown). In general, the smallest printed dot size is desirable for highest resolution. In general, the smallest printed dot size with the largest dot ground diameter is optimal.

The optimized results shown in FIGS. 4-6 above are specific to the particular printing plate system and other variables, such as speed, energy density, etc., for the example discussed herein. It should be understood to those of skill in the art that different printing plate systems, different speeds, different energy densities, and other variables may impact the optimum results achievable by the process described herein, and that similar graphs and optimums can be generated for any type of print system. In general, however, the delay time between the rear side exposure and the front side exposure may generally fall in the range between 10 and 200 seconds, more preferably a range between 2 and 100 seconds, and most preferably in a range of between 5 and 20 seconds. Minimizing the delay time minimizes overall processing time, and thus has an impact on overall throughput of a system. Accordingly, optimizing other conditions to minimize the time delay may also be beneficial.

Although the exemplary system shown in FIG. 1 illustrates the time delay schematically in a linear system, it should be understood that various exposure systems may be devised to provide the optimized time delay. In such exemplary systems, the UV light sources may comprise, for example and without limitation, LEDs, arrays of LEDs, fluorescent lights, such as fluorescent tubes, arc discharge lamps, or any other UV light source known in the art. Although described herein in connection with a UV system and referring to "UV light", it should be understood that the technology described herein is not specific to any particular type of radiation wavelength, visible or non-visible, and that the system may utilize any type of actinic radiation or other radiation that is functional to cause the photochemical reaction necessary to cure the type of plate used. Thus, the term "light source" as used herein refers to any type of actinic radiation source.

In one embodiment 700 depicted in FIG. 7, the printing plate 730 may be mounted on a transparent (e.g. glass) cylinder 760 rotating at a predetermined speed, with the main radiation source 710 disposed in a first location along the cylindrical path of rotation adjacent the external surface of the cylinder, and the back side radiation source 720 disposed in a second location along the cylindrical path of rotation adjacent the internal surface of the cylinder, with the respective locations of the sources spaced apart by the distance required to provide the time delay required at the speed of rotation. In such a system, the location of the light sources and/or the speed of rotation may be variable to provide different time delays. The photosensitive printing plate 730 may be a sleeve, such as a sleeve designed to fit over the transparent cylinder 760 of the system described above, or may be flat, but sufficiently flexible, to permit it to be disposed on and secured to the surface of the cylinder. It should be understood that the term "transparent" as used herein may refer to any material that permits a desired amount of radiation at the desired wavelength pass through the selected material. Thus, "transparent" as used herein, may refer to a material that is not visibly transparent or even translucent to the human eye.

Figure 8:
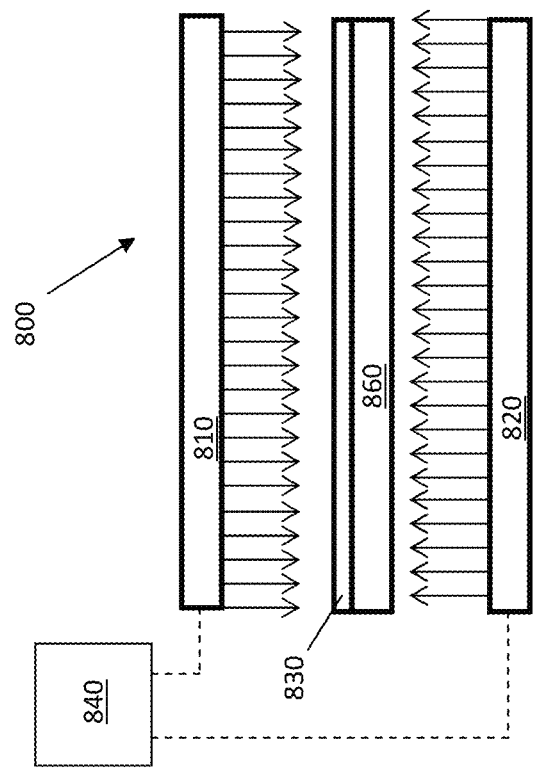
FIG. 8 is a schematic drawing depicting an apparatus featuring a planar radiation source for the front and back exposure of a photosensitive printing plate in accordance with aspects of the invention.

In another exemplary embodiment 800, depicted in FIG. 8, each collective radiation source 810, 820 may emit a planar radiation field that is at least coextensive with both lateral dimensions of plate 830 (e.g. each collective radiation source 810, 820 may be configured to irradiate the entire plate surface all at once when activated, if configured to be activated in that manner), in which case the controller 850 may be configured to create a delay time by creating a time difference between turning on a portion of source 820 for exposing the back surface and turning on a portion of source 810 for exposing the main surface. The printing plate 830 may lay flat on a horizontal transparent (e.g. glass) plate 860 or may hang in a vertical orientation, such as from a hangar 170 as depicted in FIG. 1. Although depicted schematically as single continuous sources 810, 820 in FIG. 8, each source 810, 820 preferably comprises a plurality of individual subsources (not shown), such as fluorescent tubes or LED point sources that are individually controllable or controllable in subsets smaller than the overall irradiation field. The plurality of subsources may be coordinated and controlled to act as a single source, or individually activated in a desired pattern. For example, in a configuration comprising a plurality of stationary subsources and a stationary plate, the individual subsources may be independently controlled so that fewer than all of the individual subsources comprising source 810 are turned on at the same time and fewer than all of the individual subsources comprising source 820 are turned on the same time. The collective subsources may thus be controlled in any pattern that provides the desired time delay and avoids simultaneously irradiating the front and the back of the plate by subsources that are spatially aligned with one another relative to the same coordinates of the plate.

One exemplary control pattern may activate the radiation subsources in a sequence that causes relative motion between the radiation field and the plate, such as a movement that essentially mimics the same light patterns that would be provided by main and back linear sources attached to a carriage, but with the advantage of having no moving parts. The illumination pattern may be configured to illuminate multiple portions of the front and back simultaneously (e.g. such as in a pattern that mimics multiple carriages—one starting at one end of the plate, and one starting in the middle). The illumination pattern in such a configuration is not constrained to patterns that mimic one or more carriages, however, and may be implemented in any pattern that provides the desired time delay, overall exposure, and lack of simultaneous exposure from front and back for any particular cross sectional coordinate of the plate. The pattern may also comprise illuminating the entire back at once and then the entire front, either in a single exposure for each side, or in fractional exposures of the full required exposure for each side, with the desired time delay applied between each front and back exposure. Furthermore, although shown in a flat configuration, it should be understood that systems in which both the plate and the sources are stationary may also be arranged in a cylindrical configuration.

Optionally, the embodiment shown in FIG. 8 may also include optics (not shown). These optics may include lenses, mirrors and/or other optical hardware components to direct and/or confine the radiation emitted from the plurality of individual subsources (e.g. LEDs) to a specific area on printing plate 830. This configuration may produce a stronger contrast between the dark and illuminated areas on printing plate 830, thereby increasing accuracy of the exposure process.

In yet another exemplary embodiment 900, a stationary plate 930 may be subjected to irradiation from a single linear source 915 that is configured to pass over both the front side and back side of the plate at a speed that provides the desired time delay, with a controller 940 that, for example, may turn the source on and off at the appropriate times or modulate the amount of radiation between a main exposure intensity and a back side exposure intensity, as needed. The plate may be disposed on a substrate 960 in a horizontal system, as depicted in FIG. 9, or the system may be oriented vertically, as described in other embodiments. It should be understood that the source may travel in either direction, so long as the controller first commences irradiation at the leading edge of the back side. The structure for moving the source may comprise, for example, a holder for the source mounted to a belt or chain that moves in a desired path. The source may move at a different speed (e.g. slower) when aligned over one side of the plate to cause an exposure than it does when it is traveling between the trailing edge of one side and the leading edge of the other side. In most embodiments, because the time delay is generally a fraction of the overall exposure time needed to expose the plate, this embodiment may be commercially practical only in processes in which the total exposure is spread over multiple passes.

It should be understood that the invention is not limited to any particular physical embodiment, and that the method of the invention of incorporating an optimized delay between back side and front side exposure may be performed in any system having any physical configuration.

Figure 10:
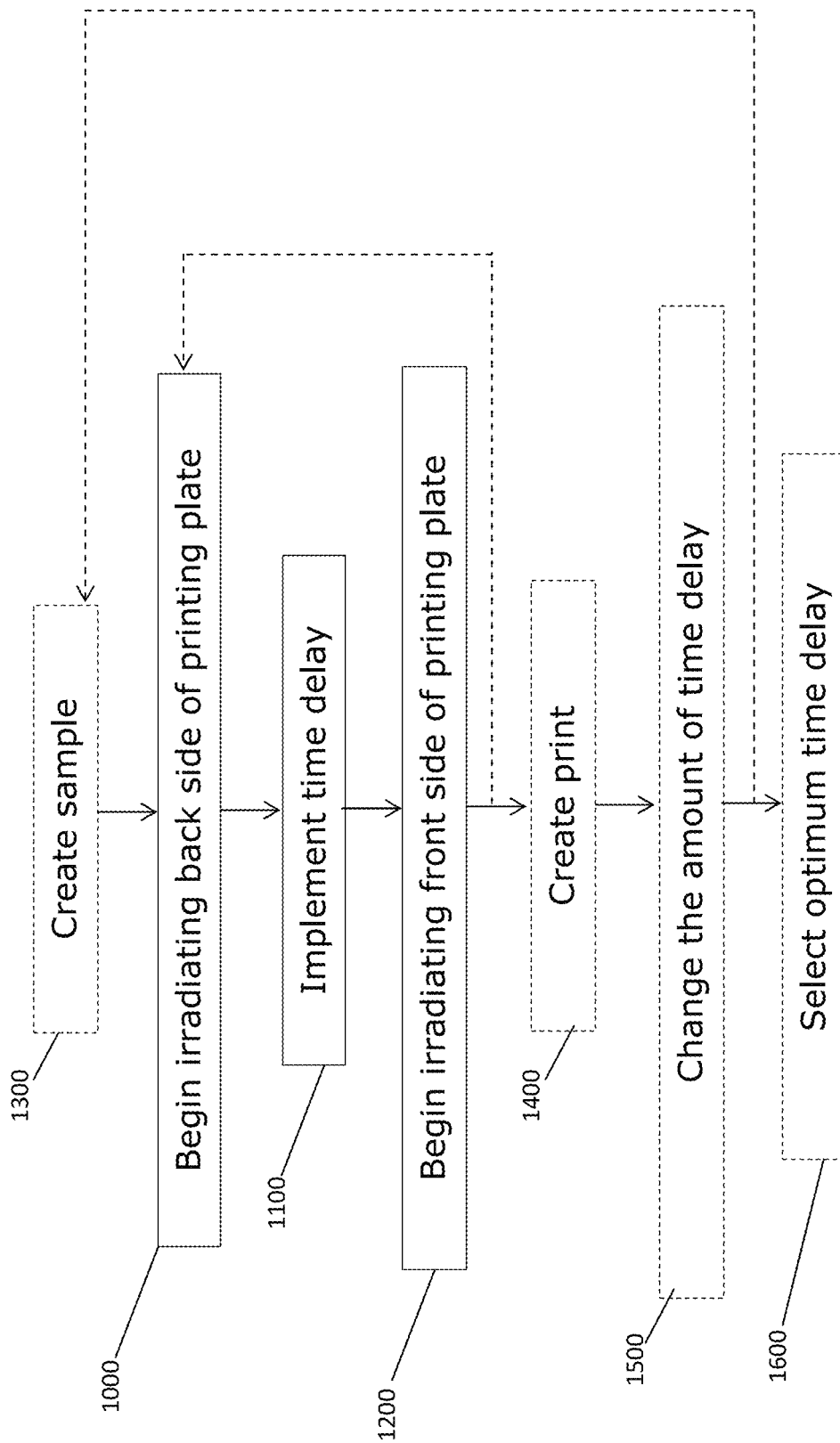
FIG. 10 is a flowchart depicting an exemplary method of the invention.

FIG. 10 illustrates an exemplary method for preparing a printing plate in accordance with the invention, including in step 1000, commencing irradiating the back side of the printing plate, implementing a defined time delay in step 1100, and then, immediately at the end of the time delay, commencing irradiating the front side of the printing plate in step 1200. In one embodiment, the exposure may be carried out using a multitude of consecutive exposure steps, in which each step contributes a fraction of the total energy dose required for complete curing of the plate, as is known in the art. In accordance with the invention, however, each exposure step includes the requisite time delay. Thus, as depicted in FIG. 10, in such an embodiment, each radiation step 1000 and 1200 may comprise only a fraction of the total radiation desired, and steps 1000, 1100, and 1200 may be repeated until the plate has been exposed to the total amount of radiation desired.

In a method for optimizing the time delay for a specific type of printing plate at a specific set of exposure conditions, also illustrated in FIG. 10, the method further comprises creating a first sample in step 1300, performing steps 1000, 1100, and 1200 on the sample at the specific set of exposure conditions, creating a print corresponding to the sample in step 1400, changing the time delay in step 1500, and then creating a new sample in step 1300 and performing steps 1000, 1100, and 1200 on the new sample. Steps, 1300, 1000, 1100, 1200, 1400, and 1500 may be repeated in sequence for a plurality of samples as many times as desired. Then, in step 1600, the optimum time delay is selected. In some embodiments, the time delay corresponding to the print having the smallest print dots may be optimal. In others, the optimum time delay may correspond to a minimum value for the smallest printed minimum dot diameter that coincides with a maximum value for the dot ground diameter for a range of time delay values.

Figure 13:
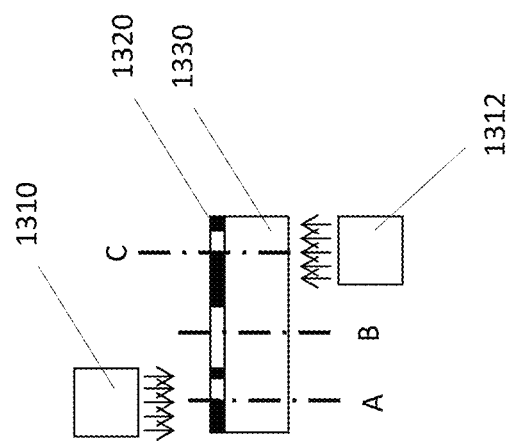
FIG. 13 is a schematic drawing depicting a portion of the plate during exposure.

Notably, as illustrated in FIG. 1, front side radiation source 110 and back side radiation source 120 do not spatially overlap one another. Thus, in relative motion systems, in addition to distance D between the leading edge 122 of light source 120 and the leading edge 112 of light source 110 (which may be an adjustable distance), there is also preferably a distance (d) between the trailing edge 124 of light source 120 and leading edge 112 of light source 110. In other words, as illustrated in FIG. 13, at no time is any specific cross-sectional coordinate A, B, or C on the plate being exposed from both the front side and the back side simultaneously, and thus the apparatus as a whole is configured to prevent simultaneous irradiation of any specific cross sectional coordinate on the plate. As shown in FIG. 13, showing a snapshot of a particular portion of the plate during a specific moment in time during exposure, section A of plate 1330, which has ablated mask 1320 on a top layer thereof, is irradiated by top source 1310, section B is not irradiated by either source, and section C is irradiated by bottom source 1312, but there is no cross sectional coordinate corresponding to a line parallel to A, B, or C, that is being simultaneously irradiated by both sources. However, because the time delay is a fraction of the overall exposure time for the plate, both sources are actively providing radiation to some portion of the plate simultaneously over at least a portion of the exposure time in most systems for most plate sizes. By making distance D shown in FIG. 1 adjustable, the relative motion velocity between the plate and the sources can be varied within a certain range, without changing the time delay between back and front exposure, because within that range D can be adjusted to compensate for the change in relative velocity.

Such a configuration may be provided by a spatial configuration as depicted with respect to FIG. 1, by a configuration of the controller, or by a combination thereof. Thus, in a system that does not create the time delay using a spatial distance between the main and back side radiation sources in combination with relative movement, but rather by pulsing stationary sources relative to a stationary plate, such as is depicted in system 800, back side radiation source 820 (or one or more subsources) may spatially overlap with front side radiation source 810 (or one or more of subsources), but the controller is configured so that such overlapping sources never actively irradiate the plate at the same time.

Finally, while the time delay may be the same for each area of the plate, it should be understood that depending upon the configuration of the radiation sources, controller, and control scheme, one portion of the plate may be irradiated differently than another, if desired.

Processes for Increasing Back-Exposure

As described above, photo polymer printing plates typically need UV exposure from the front side and the back side. The front side exposure is applied through the mask, which holds the image information that shall be imposed to the printing plate. The rear side is exposed to UV radiation through the rear side plastic substrate without any vignetting in order to build a polymerized support layer over the entire plate for the fine printing details located on the plates front side. This polymerized support layer is called "floor." The floor thickness determines the relief depth for a given plate thickness.

Recent advances in technology for curing of photopolymer printing plates with UV light has produced a variety of LED-based exposure units from various suppliers. These units comprising LED UV light sources are increasingly replacing so-called "bank" exposure devices that incorporate fluorescent tube technology, in which light from the fluorescent tubes typically covers the complete plate surface at one time. Because LEDs are more expensive and require more complex driver electronics, while delivering a much higher UV power-per-unit-surface-area than fluorescent tubes, many embodiments comprise a light source that covers only one dimension of the polymer plate completely (e.g. width), while using relative motion between the plate and UV head to cover the second dimension (e.g. length), to ensure all surface areas of the plate are exposed to the UV light. One example of a state of the art exposure system is the XPS 5080 system manufactured by ESKO. This exposure system is equipped with 3 identical UV heads: two for front side exposure, and one for rear side exposure.

Figure 1B:
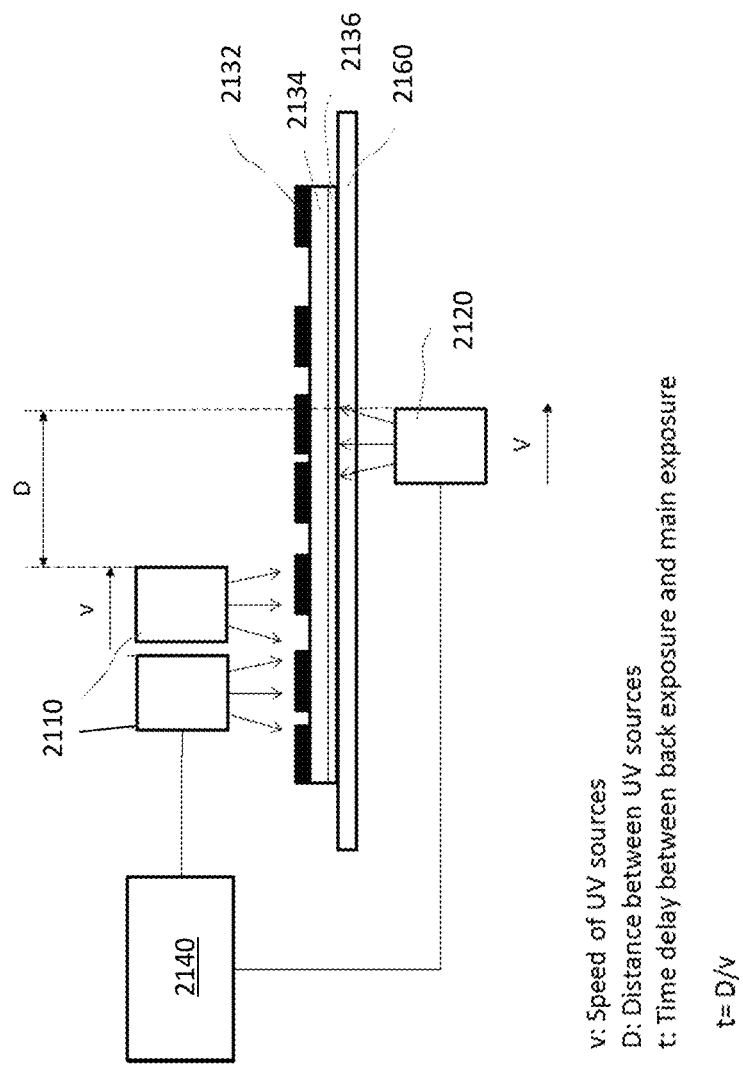
FIG. 1B is a schematic drawing depicting an exemplary apparatus, having two front-side heads and one back-side head, for the back exposure of a photosensitive printing plate in accordance with aspects of the invention.

Thus, in one embodiment of the invention, the exposure system comprises three (typically identical) UV heads (e.g. linear sources) comprising a plurality of LED sources: two heads directed to the front side (also referred to herein as the "main exposure heads"), and one head directed to the rear side (also referred to herein as the "back exposure heads"), as shown in FIG. 1B. Each UV head covers only one dimension of the plate (e.g. width) completely, with reliance on relative motion between the source and the plate to cover the other plate dimension (e.g. length), as described in other embodiments shown and described herein (see, e.g., general configuration of the linear sources in FIG. 11).

Using the apparatus and method described above may present a challenge with respect to curing photopolymer printing plates having back sides that are less sensitive to UV radiation. Such lesser sensitivity may arise from relatively higher photo-blocker content in the plate rear-side plastic substrate. One way of overcoming this challenge is to apply back exposure energy to the plate rear side prior to the combined back-main exposure steps.

For common standard polymer plates, the ratio (Rbf) between the predetermined amount of energy applied to the rear (back) side and energy applied to the front side of the plate to achieve desired results, ranges according to plate supplier information from 1:5 to 1:40, respectively 20% to 2.5%, depending on the plate type and the relief depth to be achieved.

A standard polymer printing plate, such as for example, the DuPont® model DPR 045 plate, may require approximately 12 minutes of front exposure and about 60 Seconds of back exposure for complete curing on a bank exposure unit. In an LED UV exposure unit configured such as those described herein, and in particular in the XPS 5080 system manufactured by Esko-Imaging Graphics GmbH, Rbf may be as high as 16%.

In certain highly-UV-sensitive plates, such as EXS model plates from DuPont or FTF plates from Flint, a back exposure of only about 6 seconds would optimally be required using such systems, if the plates were not otherwise adjusted. As most bank exposure units control exposure time in 1-second increments, adjusting the floor thickness with back exposure for such high sensitive plates would be very difficult to achieve, without making some adjustments to the plate structure. Hence, plate suppliers now add a higher content of UV blocker into the rear side UV-transmissive, dimensionally-stable plastic substrate of the plate, which blocks a substantial amount of UV from participating in the curing process from the rear side. Such adjustments by plate suppliers have pushed Rbf closer to, for example, approximately 50%.

Unfortunately, if the content of UV blocker inside the rear side plastic substrate is not controlled very precisely by the plate suppliers and varies from one plate charge to another, it may be necessary to control the resulting floor thickness of the plates periodically by readjusting the back exposure UV-energy accordingly.

Moreover, in many configurations, the plate typically lies flat on a glass table with its rear side adjacent the glass plate and is back-exposed through this glass plate. The glass plate typically has a UV transmission of around 80%, consuming 20% UV, thereby pushing the Rbf as high as, for example, approximately 62.5% for the exemplary plates described above.

Another demand for increase of back exposure power arises from the fact that the exposure may be applied to the plate in several fractions. Using several smaller exposure-energy factions, the curing becomes less efficient, making the total exposure energy required for complete curing higher in comparison to an exposure applied in an uninterrupted step. The loss of efficiency due to using multiple exposure steps results in another increase in Rbf, bringing it close to, for example, approximately 75% for the exemplary plates described above.

An embodiment equipped with three identical heads—one UV head for back exposure and two UV heads for main exposure—as depicted in FIG. 1B, has an inherent Rbf of 50%, while the back exposure requirements for a highly sensitive plate having the combined characteristics noted above, may require an Rbf of 75%.

It is thus not possible to adjust the floor thickness exclusively through irradiance of the rear side UV Head using three identical heads operating at the same power output, and for reasons described herein later, it may be desirable to use three identical heads with the same nominal power operating at that nominal power, for greatest efficiency and productivity. One method for supplying the missing 25% of back exposure UV power is to provide a back-only exposure step to provide the additional energy in an uninterrupted exposure into the rear side of the plate before the combined main and back exposure steps are commenced.

As shown in FIG. 1B, three identical UV heads are disposed relative to the photopolymer plate to be cured. The plate comprises a mask 2132, a photo sensitive polymer 2134 and a plastic substrate 2136 placed flat on a glass plate 2160, with the non-printing side of the plate in contact with the surface of glass plate. Two heads for the main exposure 2110, which cure the front side of the polymer printing plate, are located above the glass plate and the polymer plate thereon, and the third UV head for back exposure 2120 is located under the glass plate 2160. All parameters, like speed of the UV sources, distance between UV sources, the resulting time delay between the UV Source, the irradiance of the Sources as well as the number of exposure cycles is controlled by the control system 2140.

A standard exposure process comprises at least two exposure steps, wherein in each step the exposure heads move from a start position along the polymer plate, exposing the plate to actinic UV radiation with constant speed V in the direction of the arrow shown in FIG. 1B, and afterwards returning in the direction opposite the arrow to their start position without emitting radiation in the return pass. During this process, in accordance with aspects of the invention described herein, the back exposure is applied to the polymer plate before the main exposure by a precisely determined time difference. Accordingly, the back exposure head moves a constant distance in advance of the main exposure head during polymer plate exposure, causing a constant delay time between rear and front exposure. The distance between main UV heads and back exposure head, and consequently the delay time, is typically adjustable.

As described herein, total exposure time is determined by UV output aperture of the UV heads in traveling direction, the speed by which the heads travel along the polymer plate and the number of passes the head moved along the plate. The width of the UV output aperture divided by the traveling speed results in the time that a pixel in the plate "sees" UV light. This time is called "pixel time" in the following text.

The intent of the foregoing method is to obtain a cure of the polymer plate that is superior to a simple front and backside exposure each applied in only one uninterrupted step. "Superior" in this case means the plate holds smaller printing details, which are fixed to the plate floor with higher stability and that do not bend during printing. Producing smaller print dots enables production of lighter highlights in the print.

The back exposure energy is increased or decreased to adjust the floor thickness of the plate. This can be done either by adjusting the irradiance of the back exposure UV head, by adjusting the pixel time, or by adjusting both pixel time and irradiance. Due to the nature of the curing process, changing the pixel time is disfavored, as it can also affect the front exposure results, which may lead to unwanted curing and printing results. Thus the preferred method for adjusting the plate floor thickness is to change the irradiance.

Productivity is a highly desirable characteristic of UV exposure devices, and thus it is favorable to run the UV light sources at the nominal UV output in order to supply the energy to the plate required for curing as fast as possible. As a consequence, both front exposure UV heads in the system depicted in FIG. 1B are preferably normally operated at nominal UV power. Depending on the energy dose ratio Rbf between back and front side exposure, it is not always possible to reach the maximum productivity, such as for example when the required back exposure energy is 75% of the energy required for front exposure, and the one head on the back side can only deliver 50% of the front exposure energy. On the other hand, equipping the back side exposure with more UV heads is disfavored, as this increases system manufacturing costs, because heads can only be added in integer numbers, which may cause too much rear side UV power for most plates.

In the example discussed above, where the irradiance of the back exposure head cannot be increased any further, absent some other remedy, the UV output of the back exposure would have to be set to maximum and the pixel time increased by 50% to reach the required floor thickness (with some corresponding change to the front exposure to adjust for the increased time). This approach may affect the quality of the front exposure curing result, and thus, it may be necessary to evaluate the complete set of exposing parameters to maintain desirable plate printing quality.

Alternatively the number of exposure cycles may be increased until the accumulated rear side exposure energy is sufficient to cure the plate floor to the required thickness. But this approach will also increase the front exposure energy, leading to higher energy input if the front exposure irradiance stays the same as before the increase in the number of cycles, which may lead to different curing and printing results. Also if the irradiance of the front exposure is reduced to maintain the front exposure energy the same as before the increase of the number of exposure cycles, this may lead to different curing and printing results, making this an imperfect solution.

Table 1 below provides a survey of different Rbf ratios for various exemplary plate types. As shown in Table 1, the Rbf ratio increases for thicker plate materials. For thicker plate material and also for the new highly-UV-sensitive materials, like the EXS plate from DuPont or the FTF plate from Flint, there is a need for further improving the efficiency of the XPS exposure device. The plates listed in the table are merely examples, and the invention is not limited only to use with digital flexographic printing plates listed.

TABLE 1

| | UV back side | | | | UV main side | | |
|---|---|---|---|---|---|---|---|
| Plate type | energy back side [mJ/cm$^2$] | Irradiance [mW/cm$^2$] | speed [mm/s] | no of cycles [n] | energy main side [mJ/cm$^2$] | Irradiance [mW/cm$^2$] | Ratio Back/Front Rbf [%] |
| DRAVE 045 | 3944 | 136 | 9.9 | 4 | 9019 | 311 | 43.7 |
| DRAVE 067 | 4350 | 150 | 9.9 | 4 | 9019 | 311 | 48.2 |

One preferred method for bringing more back side exposure energy into the plate, without sacrificing the desired printing results of the plate derived from the proper selection of exposure parameters, comprises executing one or more additional back exposure steps prior to the consecutive combined back and front exposure steps discussed herein. This additional back exposure step is preferably applied directly before starting the consecutive exposure steps.

Thus, for the processes described and depicted relative to FIG. 10, one or more back-only exposure steps for adjusting the plate floor may be sequentially performed immediately prior to step 1000. This method eliminates any need for new time-consuming parameter evaluation of all exposure steps in the event of needing to adjust the floor. For example, in processes that include step 1300-1600 for characterizing a plurality of samples, one or more back-only exposure steps may be included to set the desired amount of floor as part of the initial characterization of a particular type of plate. Then, in the event a particular batch of plates may require adjustment of the floor relative to the original amount of back-only exposure characterized for that type of plate, the adjustment process may include only adjusting the back-only exposure amount, keeping all other parameters in all other steps the same. While determining the correct adjustment for the floor may include an iterative process of generating and evaluating one or more samples with varied amounts of back-only exposure, adjustment of the floor may also be effected by merely increasing or decreasing the back-only exposure proportionally relative to the increase or decrease in floor desired.

The energy applied by the additional back exposure steps may be controlled by the exposure time, namely by the speed by which the UV head is moved along the plate rear side. In order to keep the time period for this additional exposure step as short as possible, the UV irradiance of the rear exposure UV head is ideally operated at the nominal maximum.

The amount of additional back exposure UV-energy may be controlled by controlling the irradiance of the back exposure UV-heads, by adding more back exposure steps (each step comprising a fractional amount of a total that is predetermined to be required to provide the desired floor thickness adjustment), or by some combination of irradiance, exposure time (the speed by which the UV head is moved along the polymer plate rear side), and the number of additional exposure steps.

Additional back exposure steps are added whenever the nominal back exposure irradiance is not sufficient for complete curing of the floor to the required thickness. The additional back exposure step or steps (as well as any and all of the method steps described herein) may be implemented via the apparatus controller, which controller may be in the form of computer hardware programmed with software instructions for causing the components of the apparatus to perform the subject steps. Although shown and described in connection with a certain embodiments of the invention described herein, it should be understood that exposure processes comprising additional back-exposure steps are not limited to any particular process or apparatus. Similarly, although the use of additional back-only exposure steps may be particularly suitable for UV exposure systems, this aspect of the invention is not limited to any particular radiation system.

Although the invention is illustrated and described herein with reference to specific embodiments, the invention is not intended to be limited to the details shown. Rather, various modifications may be made in the details within the scope and range of equivalents of the claims and without departing from the invention.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. An apparatus for preparing a printing plate comprising a photosensitive polymer activated by exposure to actinic radiation, the printing plate having a non-printing back side and a printing front side with a mask for defining an image to be printed, the printing plate having a lateral width and a lateral length and disposed in a stationary position, the apparatus comprising:

a plurality of radiation sources configured to emit the actinic radiation toward the printing plate in the stationary position, each of the radiation sources comprises a light emitting diode (LED) configured to emit actinic ultraviolet (UV) radiation, the plurality of radiation sources including:

a set of front LED sources positioned to emit radiation toward the front side of the plate, the set of front LED sources together defining a collective irradiation field covering an area at least coextensive with at least one of the lateral length and lateral width of the plate;

a set of back LED sources positioned to emit radiation toward the back side of the plate, the set of back LED sources together defining a collective irradiation field covering an area at least coextensive with at least one of the lateral length and lateral width of the plate; and a controller connected to the plurality of radiation sources and configured to activate the plurality of radiation sources to emit the actinic radiation in a predetermined pattern that includes a time difference between activation of at least a portion of the set of back LED sources and activation of at least a portion of the set of front LED sources, wherein the plate is in contact with atmospheric air and comprises oxygen distributed throughout the photosensitive polymer, and the time difference is selected to optimize oxygen diffusion from the front side of the plate to the back side of the plate after activation of the portion of the set of back LED sources.

2. The apparatus of claim 1, further comprising a holder for disposing the printing plate in the stationary position, the holder comprising a material that is transmissive of the actinic radiation.

3. The apparatus of claim 2, wherein the holder defines a horizontal surface relative to a ground on which the apparatus is disposed.

4. A system for preparing a printing plate, the system comprising:
the apparatus of claim 3;
an imager configured to define the image on the mask of the apparatus;
a handling device configured to move the plate from the imager to the substrate.

5. The system of claim 4, wherein the set of back LED sources are stationary.

6. The system of claim 4, wherein the set of front LED sources are attached to a carriage configured to traverse the plate longitudinally.

7. The system of claim 4, wherein the plurality of radiation sources are controllable in subsets smaller than an entirety of the collective irradiation field corresponding to each set.

8. The system of claim 7, further comprising a sensor configured to measure incident radiation at a predetermined distance from each subset of LED sources.

9. The system of claim 8, wherein each subset of LED sources has a variable intensity configured to be varied by a factor relative to other subsets in the set, based upon the incident radiation measured by the sensor, to give the radiation emitted by the set an intended degree of homogeneity.

10. The apparatus of claim 3, wherein the set of back LED sources is configured to cover an area at least coextensive with both the lateral length and lateral width of the plate, and the controller is configured to activate all of the plurality of back LED sources simultaneously.

11. The apparatus of claim 3, wherein the set of front LED sources and the controller are configured to provide a radiation field that moves relative to the plate.

12. The apparatus of claim 3, wherein the plurality of radiation sources in each of the set of front LED sources and the set of back LED sources are configured in subsets smaller than an entirety of the collective irradiation field corresponding to the respective set, each subset comprising an array of LED point sources arranged in a plurality of lines.

13. The apparatus of claim 12, wherein each subset is controllable separately from each other subset.

14. The apparatus of claim 13, further comprising a sensor configured to measure incident radiation at a predetermined distance from each controllable subset of LED sources and each subset of LED sources has a variable intensity configured to be varied by a factor relative to other subsets in the set, based upon the incident radiation measured by the sensor, to give the radiation emitted by the set an intended degree of homogeneity.

15. The apparatus of claim 3, wherein each of the set of front LED sources and the set of back LED sources are attached to a carriage configured to traverse the plate longitudinally, and the front LED sources and the back LED sources are spaced apart from one another by a lateral distance.

16. The apparatus of claim 15, wherein the lateral distance is adjustable.

17. The apparatus of claim 1, further comprising a holder for disposing the printing plate in the stationary position, wherein the holder is configured to hold the plate in a vertical orientation relative to a ground on which the apparatus is disposed.

18. The apparatus of claim 1, wherein the predetermined pattern includes all of the set of front LED sources emitting actinic radiation simultaneously, all of the set of back LED sources emitting actinic radiation simultaneously, or a combination thereof.

19. The apparatus of claim 1, wherein each of the plurality of radiation sources are individually controllable or controllable in subsets smaller than an entirety of the collective irradiation field corresponding to each set.

20. The apparatus of claim 19, wherein the predetermined pattern precludes simultaneously irradiating the front and the back of the plate by respective LEDs spatially aligned with one another relative to a same cross-sectional coordinate of the plate.

21. The apparatus of claim 20, wherein the predetermined pattern includes activation of all of the set of back LED sources simultaneously and then all of the set of front LED sources simultaneously, with a predetermined time delay applied between each front and back exposure.

22. The apparatus of claim 1, wherein the predetermined pattern includes activating at least some of the plurality of radiation sources in a plurality of exposure steps, each exposure step including emission of actinic radiation at an energy less than a full amount of energy required to cure a corresponding side of the plate to a desired degree of curing.

23. The apparatus of claim 1, further comprising optics to direct and/or confine the radiation emitted from each set of LED sources.

24. The apparatus of claim 23, wherein the optics include mirrors.

25. The apparatus of claim 1, wherein the predetermined pattern includes delivery emission of a first radiation intensity in one exposure step and emission of a second, lesser exposure intensity in another exposure step.

26. The apparatus of claim 25, wherein the predetermined pattern includes emission of the first radiation intensity in the one exposure step and emission of the second, lesser exposure intensity in the other exposure step by a same set of LED sources, wherein the same set of LED sources is selected from the group consisting of: the set of front LED sources and the set of back LED sources.

27. The apparatus of claim 25, wherein the set of front LED sources has a first nominal radiation intensity and the set of back LED sources has a second nominal radiation intensity.

28. The apparatus of claim 27, wherein the predetermined pattern includes activation of the back LED point sources at the second nominal radiation intensity in one exposure step, and activation of the back LED point sources at a radiation intensity less than the second nominal intensity in another exposure step.

29. The apparatus of claim 1, wherein one or both of the set of front LED sources and the set of back LED sources are stationary.

30. The apparatus of claim 1, wherein each set of LED sources comprises a plurality of discrete arrays having a plurality of individual LED point sources on each array, with the plurality of LED point sources arranged in a plurality of lines.

31. The apparatus of claim 30, wherein the plurality of LED point sources on each array are controllable together.

32. The apparatus of claim 30, wherein the plurality of LED point sources on each array are individually controllable.

33. The apparatus of claim 30, wherein the plurality of LED point sources on each array are controllable in groups.

34. The apparatus of claim 33, wherein each line of LED point sources in each array is separately controllable.

35. The apparatus of claim 34, wherein a radiation output generated by at least one line of LED point sources differs from a corresponding radiation output generated by at least one other line of LED point sources for a same amount of input energy, wherein the controller is configured to control a radiation intensity produced by each line to achieve an intended degree of homogeneity.

36. A method of calibrating the apparatus of claim 35, the method comprising periodically characterizing radiation intensity generated by a plurality of lines of LED point sources and adjusting input energy to the respective plurality of lines of LED point sources to account for variations in the lines over time.

37. The method of claim 36, wherein the characterization is performed by positioning a sensor that measures incident radiation at a predetermined distance from each line of LED point sources.

38. The method of claim 36, further comprising tailoring radiation intensity of one or more groups of the LED point sources to compensate for variations in transmissivity of a structure that lies between the sources and the printing plate.

39. The apparatus of claim 1, wherein the time difference is in a range of between 2 and 100 seconds.

40. The apparatus of claim 1, wherein the time difference is in a range of between 5 and 20 seconds.

41. An apparatus for preparing a printing plate comprising a photosensitive polymer activated by exposure to actinic radiation, the printing plate having a non-printing back side and a printing front side with a mask for defining an image to be printed, the printing plate having a lateral width and a lateral length and disposed in a stationary position, the apparatus comprising:
 a plurality of radiation sources configured to emit the actinic radiation toward the printing plate in the stationary position, each of the radiation sources comprises a light emitting diode (LED) configured to emit actinic ultraviolet (UV) radiation, the plurality of radiation sources including:
 a set of front LED sources positioned to emit radiation toward the front side of the plate, the set of front LED sources together defining a collective irradiation field covering an area at least coextensive with the lateral length and lateral width of the plate;
 a set of back LED sources positioned to emit radiation toward the back side of the plate, the set of back LED sources together defining a collective irradiation field covering an area at least coextensive with the lateral length and lateral width of the plate; and
 a controller connected to the plurality of radiation sources and configured to activate the plurality of radiation sources to emit the actinic radiation in a predetermined pattern that includes a time difference between activation of at least a portion of the set of back LED sources and activation of at least a portion of the set of front LED sources,
 wherein each of the plurality of radiation sources are individually controllable or controllable in subsets smaller than an entirety of the collective irradiation field corresponding to each set and the predetermined pattern comprises a sequence that mimics relative motion between the irradiation field and the plate.

42. An apparatus for preparing a printing plate comprising a photosensitive polymer activated by exposure to actinic radiation, the printing plate having a non-printing back side and a printing front side with a mask for defining an image to be printed, the printing plate having a lateral width and a lateral length and disposed in a stationary position, the apparatus comprising:
 a plurality of radiation sources configured to emit the actinic radiation toward the printing plate in the stationary position, each of the radiation sources comprises a light emitting diode (LED) configured to emit actinic ultraviolet (UV) radiation, the plurality of radiation sources including:
 a set of front LED sources positioned to emit radiation toward the front side of the plate, the set of front LED sources together defining a collective irradiation field covering an area at least coextensive with the lateral length and lateral width of the plate;
 a set of back LED sources positioned to emit radiation toward the back side of the plate, the set of back LED sources together defining a collective irradiation field covering an area at least coextensive with the lateral length and lateral width of the plate; and
 a controller connected to the plurality of radiation sources and configured to activate the plurality of radiation sources to emit the actinic radiation in a predetermined pattern that includes a time difference between activation of at least a portion of the set of back LED sources and activation of at least a portion of the set of front LED sources,
 wherein each of the plurality of radiation sources are individually controllable or controllable in subsets smaller than an entirety of the collective irradiation field corresponding to each set, the predetermined pattern precludes simultaneously irradiating the front and the back of the plate by respective LEDs spatially aligned with one another relative to a same cross-sectional coordinate of the plate, and the predetermined pattern includes activation of multiple portions of the set of front LED sources and the set of back LED sources simultaneously.

43. The apparatus of claim 42, wherein the predetermined pattern includes activation of the multiple portions simultaneously in a pattern that mimics multiple carriages.

44. A method for exposing a photopolymer printing plate to actinic radiation from a UV LED radiation source, the photopolymer printing plate having a non-printing back side and a printing front side with a mask for defining an image to be printed, the method comprising the steps of:
 a) positioning the photopolymer printing plate in an exposure unit, wherein the exposure unit comprises a plurality of UV LED radiation sources; and
 b) exposing the photopolymer printing plate through the mask to actinic radiation from the plurality of UV LED radiation sources to cure a portion of the photopolymer in the plate in an exposure step during which the plurality of UV LED radiation sources and the photocurable printing plate do not move relative to each other, including providing a first exposure intensity in a first exposure step and a second exposure intensity, different than the first exposure intensity, in a second exposure step, including performing the first exposure step with the plurality of UV LED radiation sources emitting at a nominal intensity, and performing the second exposure step with the plurality of UV LED radiation sources emitting at less than the nominal intensity.

45. The method of claim 44, wherein the exposure unit further comprises optics, including mirrors, wherein the exposure step comprises directing the radiation emitted from the plurality of UV LED radiation sources with the mirrors.

46. The method of claim 44, wherein the plurality of UV LED radiation sources comprises one or more sets of LED sources, each set of LED sources together defining a collective irradiation field covering an area at least coextensive with a lateral length and lateral width of the plate.

47. The method of claim 44, wherein the plurality of UV LED radiation sources emits the actinic radiation at a first intensity, wherein the actinic radiation reaching a photocurable surface of the printing plate is less than the first intensity.

48. The method of claim 47, wherein a portion of the actinic radiation emitted by the plurality of UV LED radiation sources is not transmitted by a surface on which the plate is mounted, is blocked by a substrate on which the photocurable polymer is disposed, or a combination thereof.

49. The method of claim 44, comprising providing a plurality of back exposure steps including at least a first back-only exposure step and a second back exposure step followed by a predetermined time delay followed by a front exposure step, the method comprising adjusting the intensity of the one or more of the plurality of UV LED radiation sources in at least one of the back exposure steps to provide a predetermined ratio Rbf between front side and back side exposure of the printing plate.

\* \* \* \* \*